US012658237B2

(12) United States Patent
    Choi et al.

(10) Patent No.: US 12,658,237 B2
(45) Date of Patent: Jun. 16, 2026

(54) INTEGRATED CIRCUIT DEVICE

(71) Applicant: Samsung Electronics Co., Ltd.,
        Suwon-si (KR)

(72) Inventors: Minho Choi, Suwon-si (KR); **Jiho
        Park, Suwon-si (KR); Jaemin Lee,**
        Suwon-si (KR); Sena Choi, Suwon-si
        (KR); Jaybok Choi, Suwon-si (KR);
        Taeseop Choi, Suwon-si (KR); **Yejin
        Ha, Suwon-si (KR); Youngwook Park,**
        Suwon-si (KR); Jihyun Hwang,
        Suwon-si (KR)

(73) Assignee: **SAMSUNG ELECTRONICS CO.,
        LTD.,** Suwon-si (KR)

( * ) Notice: Subject to any disclaimer, the term of this
        patent is extended or adjusted under 35
        U.S.C. 154(b) by 127 days.

(21) Appl. No.: 18/797,883

(22) Filed: Aug. 8, 2024

(65) Prior Publication Data

US 2025/0210092 A1     Jun. 26, 2025

(30) Foreign Application Priority Data

Dec. 20, 2023     (KR) ........................ 10-2023-0187524

(51) Int. Cl.
    *G11C 16/04*         (2006.01)
    *G11C 5/06*          (2006.01)
    *G11C 11/408*        (2006.01)
    *G11C 11/4091*       (2006.01)
    *H10B 12/00*         (2023.01)
(52) U.S. Cl.
    CPC .......... *G11C 11/4085* (2013.01); *G11C 5/063*
        (2013.01); *G11C 11/4091* (2013.01); *H10B
        12/482* (2023.02); *H10B 12/485* (2023.02);
        *H10B 12/488* (2023.02); *H10B 12/50*
                                            (2023.02)
(58) Field of Classification Search
    CPC .. G11C 11/4085; G11C 5/063; G11C 11/4091
    See application file for complete search history.

(56)             References Cited

U.S. PATENT DOCUMENTS 8,901,700  B2    12/2014  Parekh et al.
    8,987,112  B2     3/2015  Oh
    2011/0057287  A1   3/2011  Mitsuhira et al.
    2012/0091554  A1   4/2012  Lee
    2014/0374692  A1*  12/2014  Rho ................... H10N 70/8836
                                                    257/5
    2020/0006360  A1   1/2020  Chen et al.
    2022/0189968  A1   6/2022  Park et al.
            (Continued)

*Primary Examiner* — Pho M Luu
(74) *Attorney, Agent, or Firm* — Muir Patent Law, PLLC

(57)             ABSTRACT

An integrated circuit device includes a substrate having a
cell array area, a peripheral circuit area including a core area,
and an interface area between the cell array area and the core
area, a cell device isolation film defining cell active regions
in the cell array area and having a first depth in a vertical
direction, peripheral device isolation films defining periph-
eral active regions in the peripheral circuit area and each
having a second depth greater than the first depth in the
vertical direction, an interface device isolation film in the
interface area of the substrate, and an active dam surround-
ing the cell array area, wherein at least a first portion of the
active dam is in the core area, and at least a second portion
of the active dam is apart from the cell array area with the
interface device isolation film therebetween.

20 Claims, 38 Drawing Sheets

(56)          References Cited

U.S. PATENT DOCUMENTS

| | | |
|---|---|---|
| 2022/0238534 A1 | 7/2022 | Seong et al. |
| 2023/0223275 A1* | 7/2023 | Li ........................... H10B 12/09 |
| | | 438/211 |
| 2024/0055301 A1* | 2/2024 | Higa ................... H10D 62/127 |

\* cited by examiner

Figure 12:
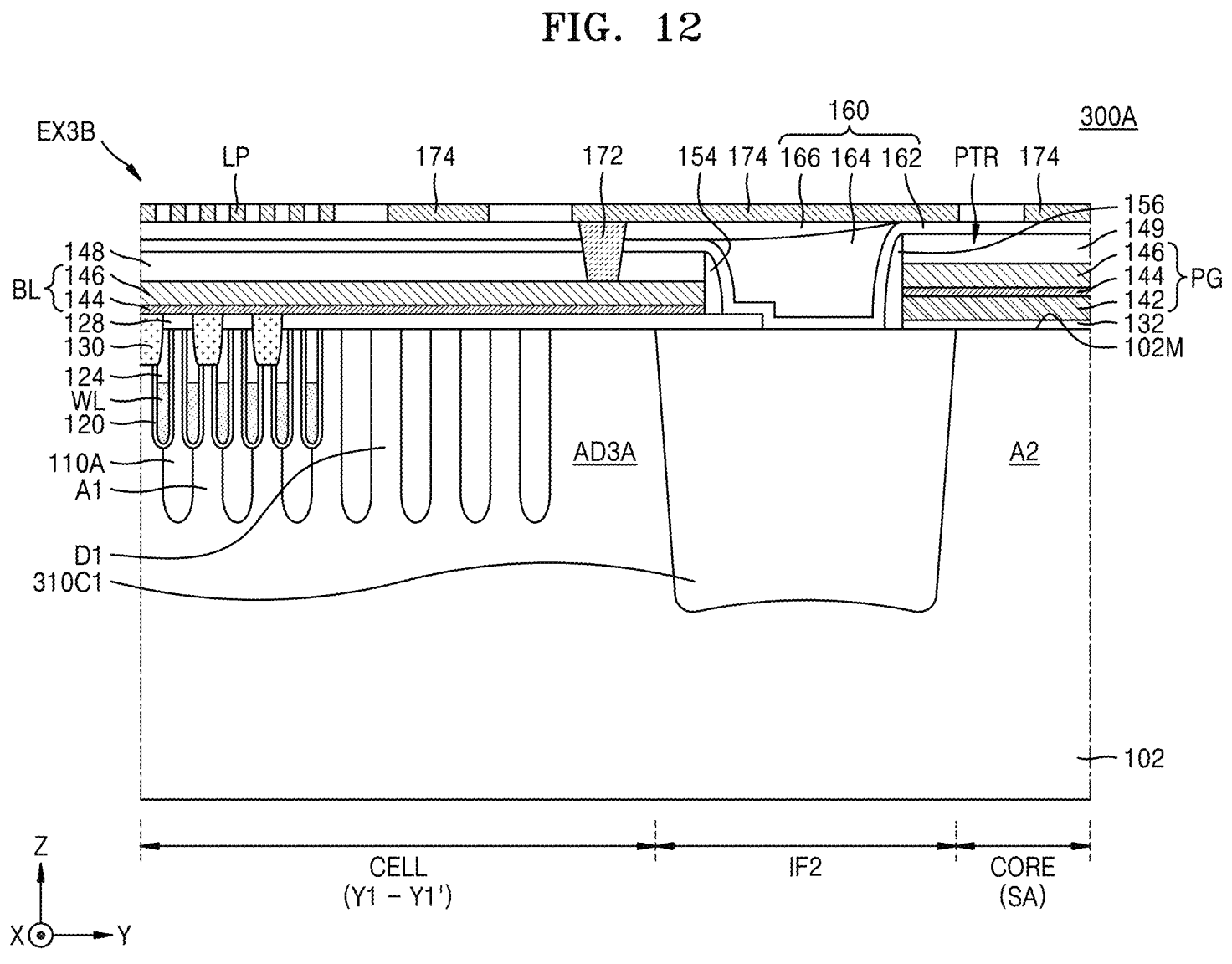

Figure 13:
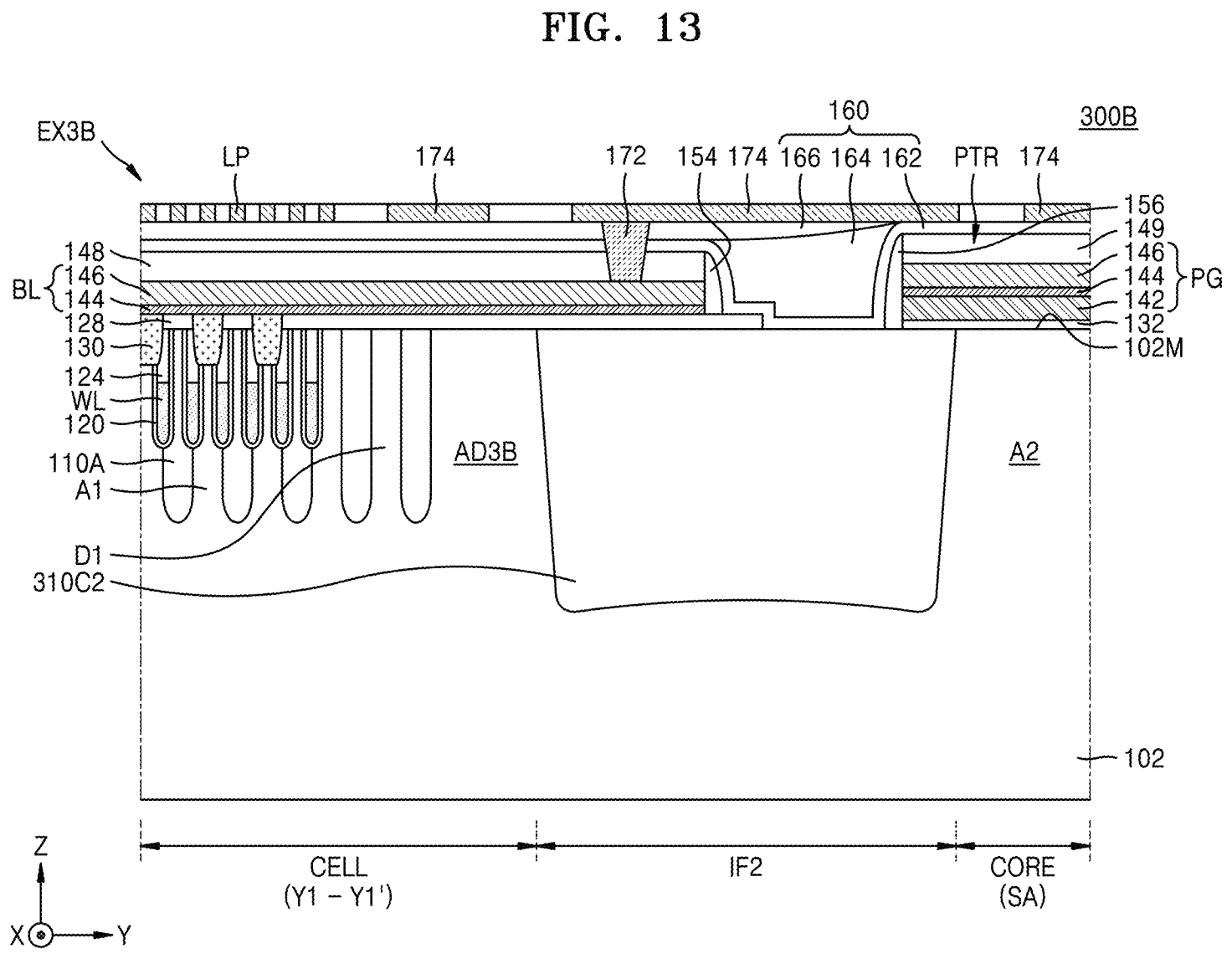

INTEGRATED CIRCUIT DEVICE

CROSS-REFERENCE TO RELATED APPLICATION

This application is based on and claims priority under 35 U.S.C. § 119 to Korean Patent Application No. 10-2023-0187524, filed on Dec. 20, 2023, in the Korean Intellectual Property Office, the disclosure of which is incorporated by reference herein in its entirety.

BACKGROUND

Aspects of the inventive concept relate to an integrated circuit device, and more particularly, to an integrated circuit device including a cell array area and a peripheral circuit area around the cell array area.

Due to the advance of electronics technology, integrated circuit devices have been rapidly down-scaled in recent years, and feature sizes of integrated circuit devices have been finer. Therefore, it is desirable to develop a novel structure allowing unit devices, which are arranged in each of a cell array area and a peripheral circuit area that includes a core region adjacent to the cell array area, to secure electrical reliability.

SUMMARY

Aspects of the inventive concept provide an integrated circuit device having a structure capable of providing optimum electrical reliability depending on the pattern density and size of each of a cell array area having a reduced area due to down-scaling and a peripheral circuit area including a core region adjacent to the cell array area.

According to an aspect of the inventive concept, an integrated circuit device includes a substrate having a cell array area, a peripheral circuit area, and an interface area, the peripheral circuit area comprising a core area that is adjacent to the cell array area, and the interface area being between the cell array area and the core area; a cell device isolation film arranged in the substrate to define a plurality of cell active regions in the cell array area of the substrate, the cell device isolation film having a first depth in a vertical direction from an upper surface of the substrate; a plurality of peripheral device isolation films arranged in the substrate to define a plurality of peripheral active regions in the peripheral circuit area of the substrate, each of the plurality of peripheral device isolation films having a second depth in the vertical direction from the upper surface of the substrate, the second depth being greater than the first depth; an interface device isolation film arranged in the interface area of the substrate; and an active dam surrounding the cell array area in a plan view, wherein at least a first portion of the active dam is in the core area, and at least a second portion of the active dam is apart from the cell array area with the interface device isolation film therebetween.

According to another aspect of the inventive concept, an integrated circuit device includes a substrate having a cell array area, a peripheral circuit area, and an interface area, the peripheral circuit area comprising a core area having a sub-word line driver area and a sense amplifier area, the interface area being between the cell array area and the sub-word line driver area and between the cell array area and the sense amplifier area, the sub-word line driver area being adjacent to the cell array area in a first horizontal direction, and the sense amplifier area being adjacent to the cell array area in a second horizontal direction that intersects with the first horizontal direction; a cell device isolation film arranged in the substrate to define a plurality of cell active regions in the cell array area of the substrate, the cell device isolation film having a first depth in a vertical direction from an upper surface of the substrate; a plurality of peripheral device isolation films arranged in the substrate to define a plurality of peripheral active regions in the sub-word line driver area and the sense amplifier area of the substrate, each of the plurality of peripheral device isolation films having a second depth in the vertical direction from the upper surface of the substrate, the second depth being greater than the first depth; an interface device isolation film in the interface area of the substrate; and an active dam surrounding the cell array area in a plan view, wherein the active dam comprises a first local region in the sub-word line driver area of the core area and a second local region in the sense amplifier area of the core area or in a portion of the cell array area, the portion of the cell array area being adjacent to the sense amplifier area.

According to another aspect of the inventive concept, an integrated circuit device includes a substrate having a cell array area, a peripheral circuit area, and an interface area, the peripheral circuit area comprising a core area having a sub-word line driver area and a sense amplifier area, the interface area being between the cell array area and the sub-word line driver area and between the cell array area and the sense amplifier area, the sub-word line driver area being adjacent to the cell array area in a first horizontal direction, and the sense amplifier area being adjacent to the cell array area in a second horizontal direction that intersects with the first horizontal direction; a cell device isolation film arranged in the substrate to define a plurality of cell active regions in the cell array area of the substrate, the cell device isolation film having a first depth in a vertical direction from an upper surface of the substrate; a plurality of word lines at a vertical level lower than a vertical level of the upper surface of the substrate, the plurality of word lines being in the cell array area and extending parallel to each other across the plurality of cell active regions in the first horizontal direction; a plurality of bit lines over the plurality of word lines in the cell array area and extending lengthwise parallel to each other in the second horizontal direction that intersects with the first horizontal direction; a plurality of peripheral device isolation films arranged in the substrate to define a plurality of peripheral active regions in the sub-word line driver area and the sense amplifier area of the substrate, each of the plurality of peripheral device isolation films having a second depth in the vertical direction from the upper surface of the substrate, the second depth being greater than the first depth; an interface device isolation film in the interface area of the substrate; and an active dam having a closed-loop shape that continuously surrounds the cell array area without interruption, in a plan view, wherein the active dam comprises a first local region in the sub-word line driver area of the core area and a second local region in the sense amplifier area of the core area or in a portion of the cell array area adjacent to the sense amplifier area.

BRIEF DESCRIPTION OF THE DRAWINGS

Embodiments will be more clearly understood from the following detailed description taken in conjunction with the accompanying drawings in which:

FIG. 1 is a block diagram illustrating an example of a configuration of an integrated circuit device according to some embodiments;

FIG. 5B is an enlarged cross-sectional view of a region EX1B of FIG. 4;

FIG. 10 is a cross-sectional view illustrating an integrated circuit device according to some embodiments;

FIGS. 12 and 13 are cross-sectional views each illustrating an integrated circuit device according to some embodiments; and FIGS. 14A to 21B are cross-sectional views illustrating a sequence of processes of an example method of manufacturing an integrated circuit device, according to some embodiments. In particular, FIGS. 14A to 14I, 15A, 16A, 17A, 18A, 19A, 20A, and 21A are cross-sectional views of a portion of the integrated circuit device, which corresponds to the region EX1A of FIG. 4, according to the sequence of processes, and FIGS. 15B, 16B, 17B, 18B, 19B, 20B, and 21B are cross-sectional views of a portion of the integrated circuit device, which corresponds to the region EX1B of FIG. 4, according to the sequence of processes.

DETAILED DESCRIPTION OF THE EMBODIMENTS

Figure 2:
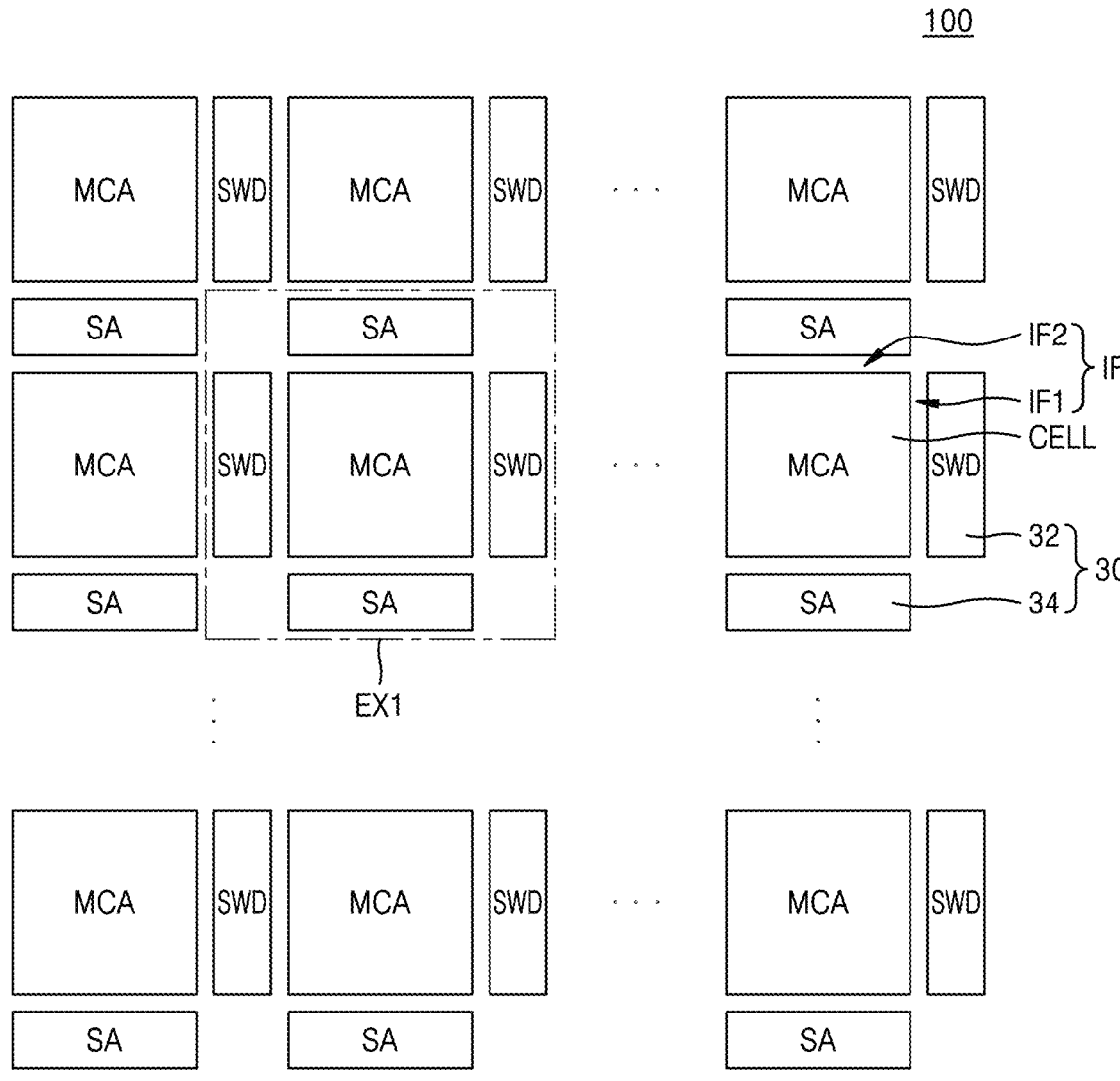
FIG. 2 is a plan view illustrating an example of an arrangement configuration in the integrated circuit device shown in FIG. 1.

Hereinafter, embodiments of the inventive concept will be described in detail with reference to the accompanying drawings. Like components are denoted by like reference numerals throughout the specification, and repeated descriptions thereof are omitted.

Figure 1:
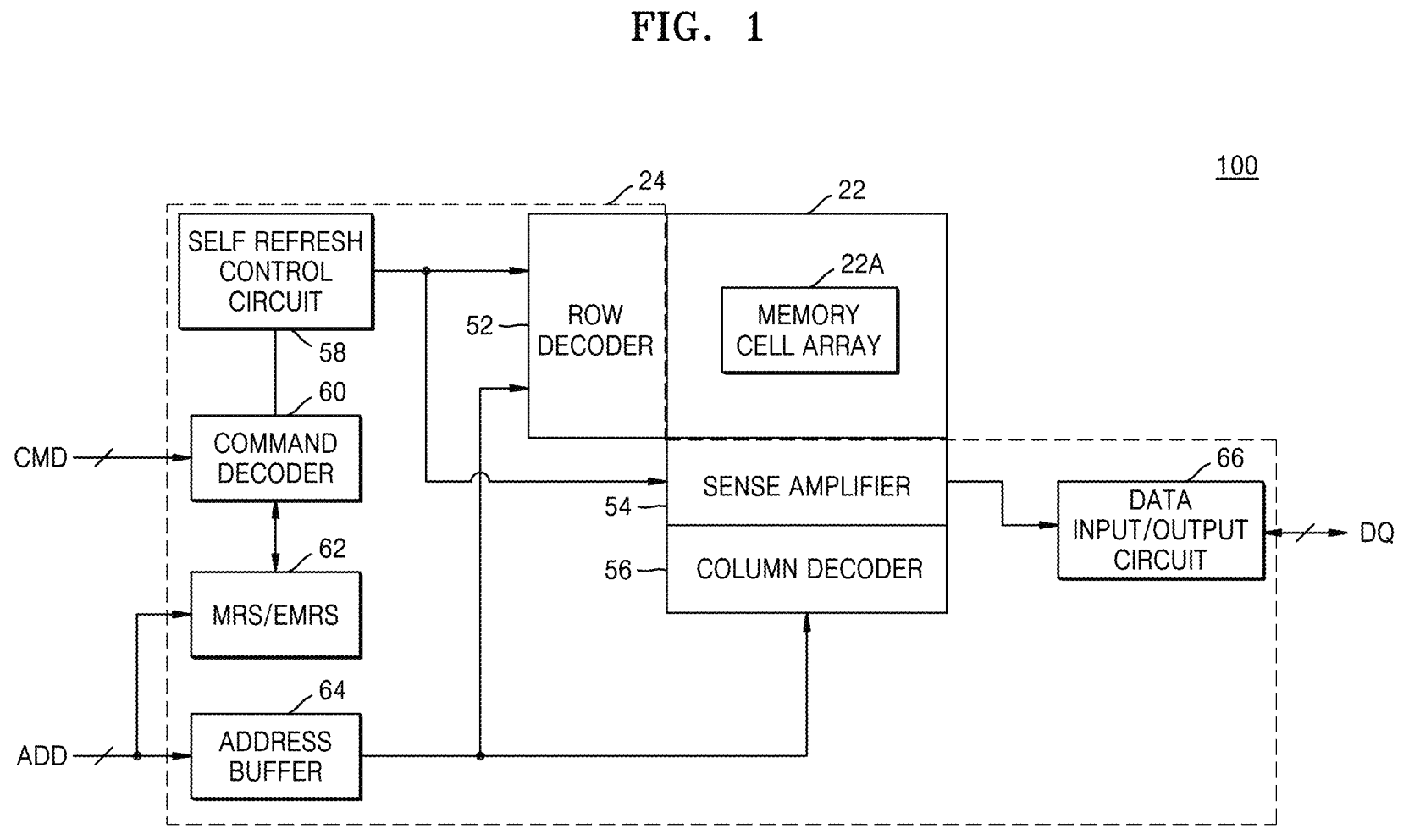

FIG. 1 is a block diagram illustrating an example of a configuration of an integrated circuit device 100 according to some embodiments.

Referring to FIG. 1, the integrated circuit device 100 includes a first area 22 and a second area 24. The first area 22 may be a memory cell area of a dynamic random access memory (DRAM) device, and the second area 24 may be an area, in which peripheral circuits of the DRAM device are formed, and a core area (hereinafter, both referred to as a "peripheral circuit area"). The first area 22 may include a memory cell array 22A. The second area 24 may include a row decoder 52, a sense amplifier 54, a column decoder 56, a self-refresh control circuit 58, a command decoder 60, a mode register set/extended mode register set (MRS/EMRS) circuit 62, an address buffer 64, and a data input/output circuit 66. Peripheral circuits, such as an inverter chain, an input/output circuit, and the like, may be further formed in the second area 24 of FIG. 1.

FIG. 2 is a diagram illustrating an example of an arrangement configuration in the integrated circuit device 100 shown in FIG. 1.

Referring to FIGS. 1 and 2, the first area 22 of the integrated circuit device 100 may include a plurality of cell array areas CELL and the second area 24 of the integrated circuit device 100 may include a core area 30 arranged adjacent to each of the plurality of cell array areas CELL. The plurality of cell array areas CELL may be portions of the first area 22 shown in FIG. 1. The core area 30 may be a portion of the second area 24 shown in FIG. 1. The core area 30 may include a sub-word line driver area 32 adjacent to one side of a cell array area CELL and a sense amplifier area 34 adjacent to another side of the cell array area CELL. In FIG. 2, "MCA" refers to a memory cell array arranged in the cell array area CELL and may correspond to the memory cell array 22A shown in FIG. 1. In FIG. 2, "SWD" refers to a sub-word line driver block arranged in the core area 30, and the sub-word line driver area 32 may also be referred to as a sub-word line driver area SWD. "SA" refers to a sense amplifier block arranged in the core area 30, and the sense amplifier area 34 may also be referred to as a sense amplifier area SA.

An interface area IF may be arranged between the cell array area CELL and the core area 30. The interface area IF may include a first interface area IF1, which is arranged between the cell array area CELL and the sub-word line driver area SWD, and a second interface area IF2, which is arranged between the cell array area CELL and the sense amplifier area SA.

The sub-word line driver area SWD may include circuits for driving a plurality of word lines arranged in the cell array area CELL. The sense amplifier area SA may include a sense amplifier for sensing and amplifying signals of a plurality of bit lines arranged in the cell array area CELL.

A conjunction block may be arranged at an intersection point between the sub-word line driver area SWD and the sense amplifier area SA in the core area 30. Power drivers and ground drivers for driving a bit line sense amplifier may be alternately arranged in the conjunction block.

Figure 3:
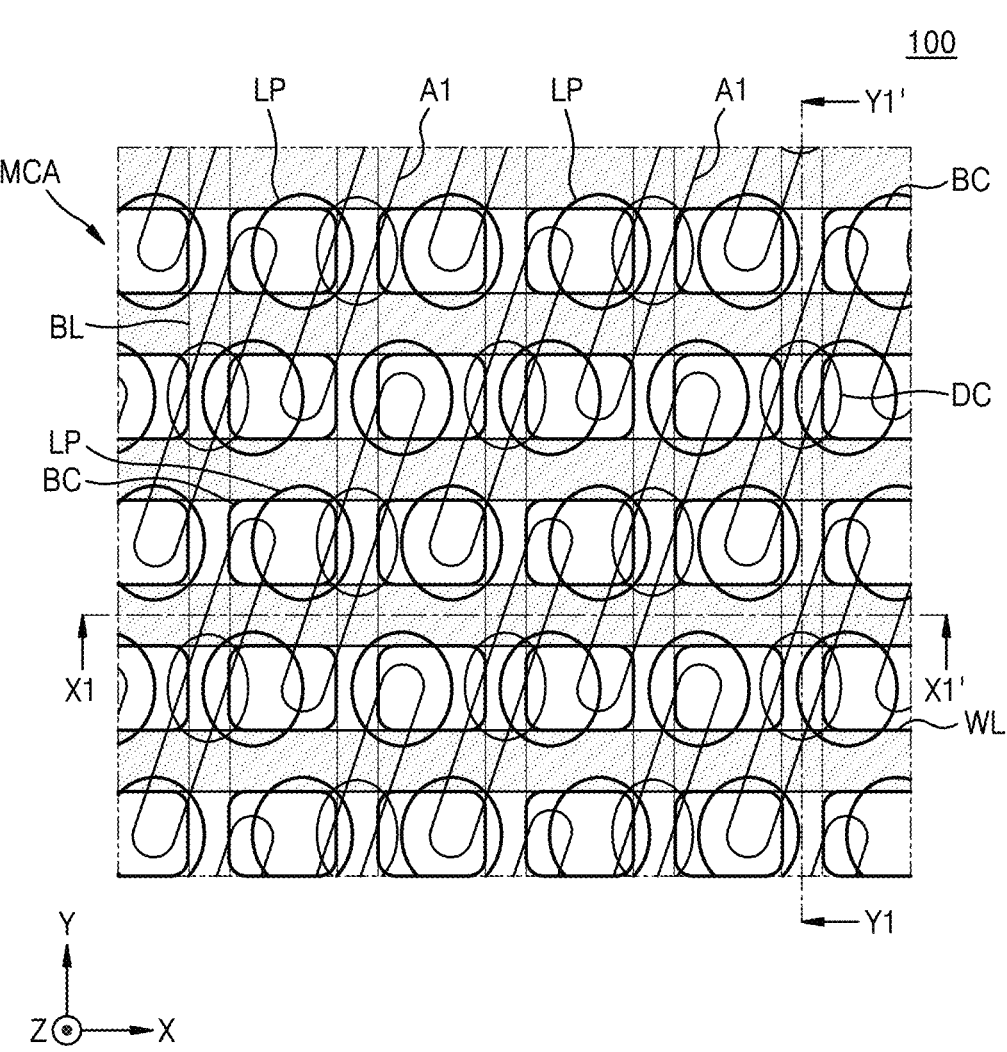
FIG. 3 is a schematic planar layout illustrating main components of a memory cell array that is included in a cell array area of an integrated circuit device according to some embodiments.

FIG. 3 is a schematic planar layout illustrating main components of the memory cell array MCA that is included in the cell array area CELL shown in FIG. 2.

Referring to FIG. 3, the memory cell array MCA may include a plurality of cell active regions A1. Each of the plurality of cell active regions A1 may be arranged to have a major axis in an oblique direction with respect to a first horizontal direction (an X direction) and a second horizontal direction (a Y direction). A plurality of word lines WL may extend parallel to each other in the first horizontal direction (the X direction) across the plurality of cell active regions A1. A plurality of bit lines BL may extend parallel to each other in the second horizontal direction (the Y direction) over the plurality of word lines WL. The first horizontal direction (the X direction) and the second horizontal direction (the Y direction) may be directions intersecting with each other. For example, the first horizontal direction (the X direction) and the second horizontal direction (the Y direction) may be directions perpendicular to each other.

Each of the plurality of bit lines BL may be connected to each of the plurality of cell active regions A1 via a direct contact DC. A plurality of buried contacts BC may be formed between two adjacent bit lines BL among the plurality of bit lines BL. The plurality of buried contacts BC may be arranged in a line in the first horizontal direction (the X direction) and the second horizontal direction (the Y direction). A plurality of conductive landing pads LP may be respectively formed on the plurality of buried contacts BC. Each of the plurality of buried contacts BC and each of the plurality of conductive landing pads LP may connect a lower electrode (not shown) of a capacitor, which is formed over each of the plurality of bit lines BL, to a cell active region A1. Each of the plurality of conductive landing pads LP may be arranged to partially overlap a buried contact BC.

Figure 4:
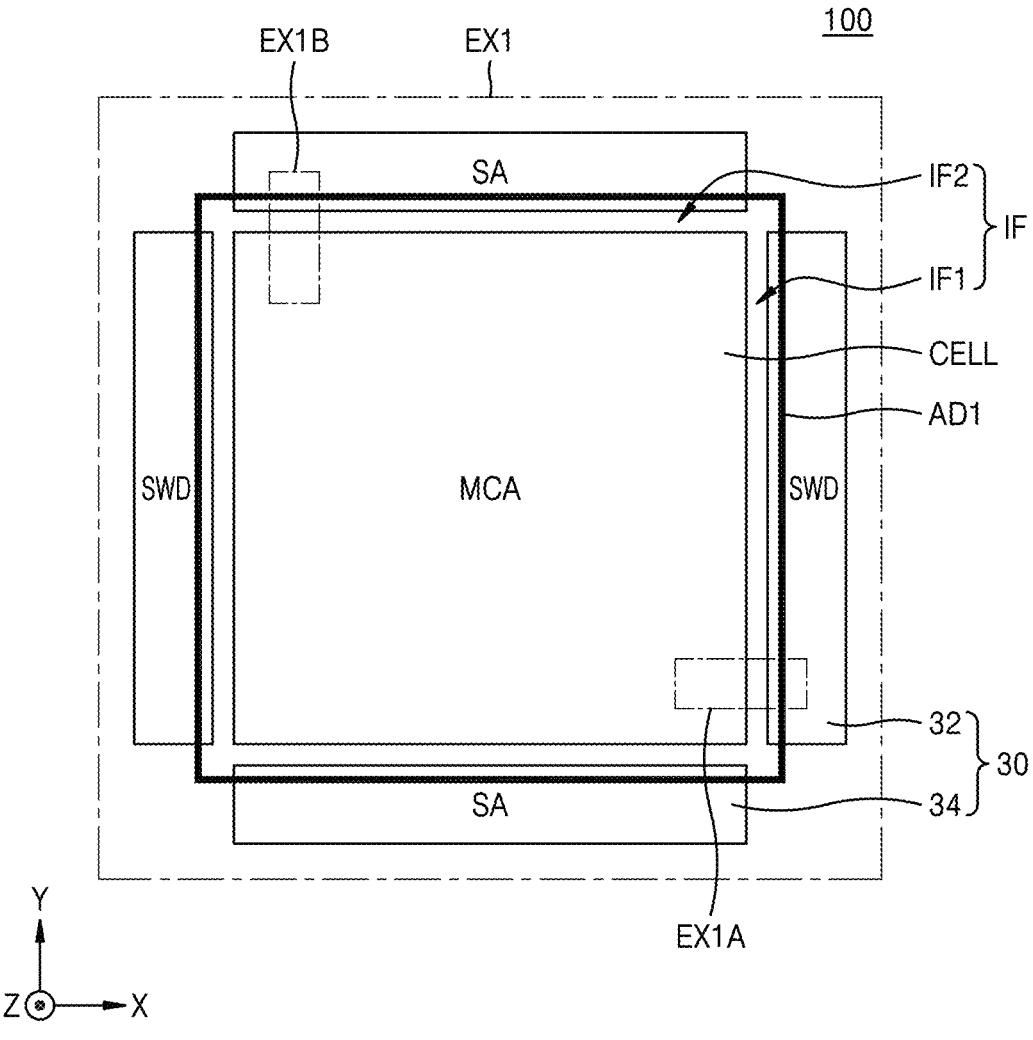
FIG. 4 is an enlarged plan view of a region EX1 of FIG. 2.
Figure 5A:
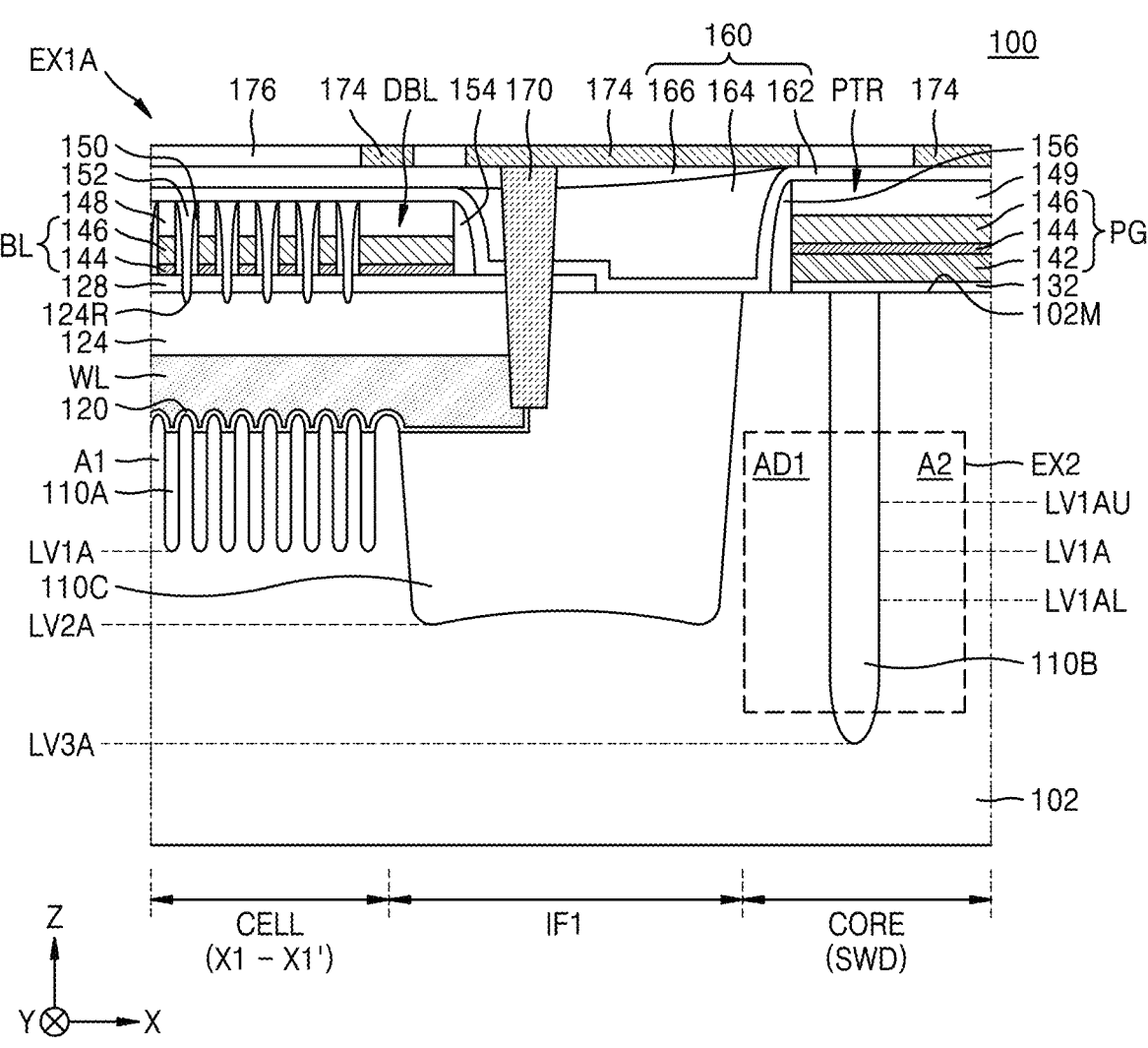
FIG. 5A is an enlarged cross-sectional view of a region EX1A of FIG. 4.
Figure 5B:
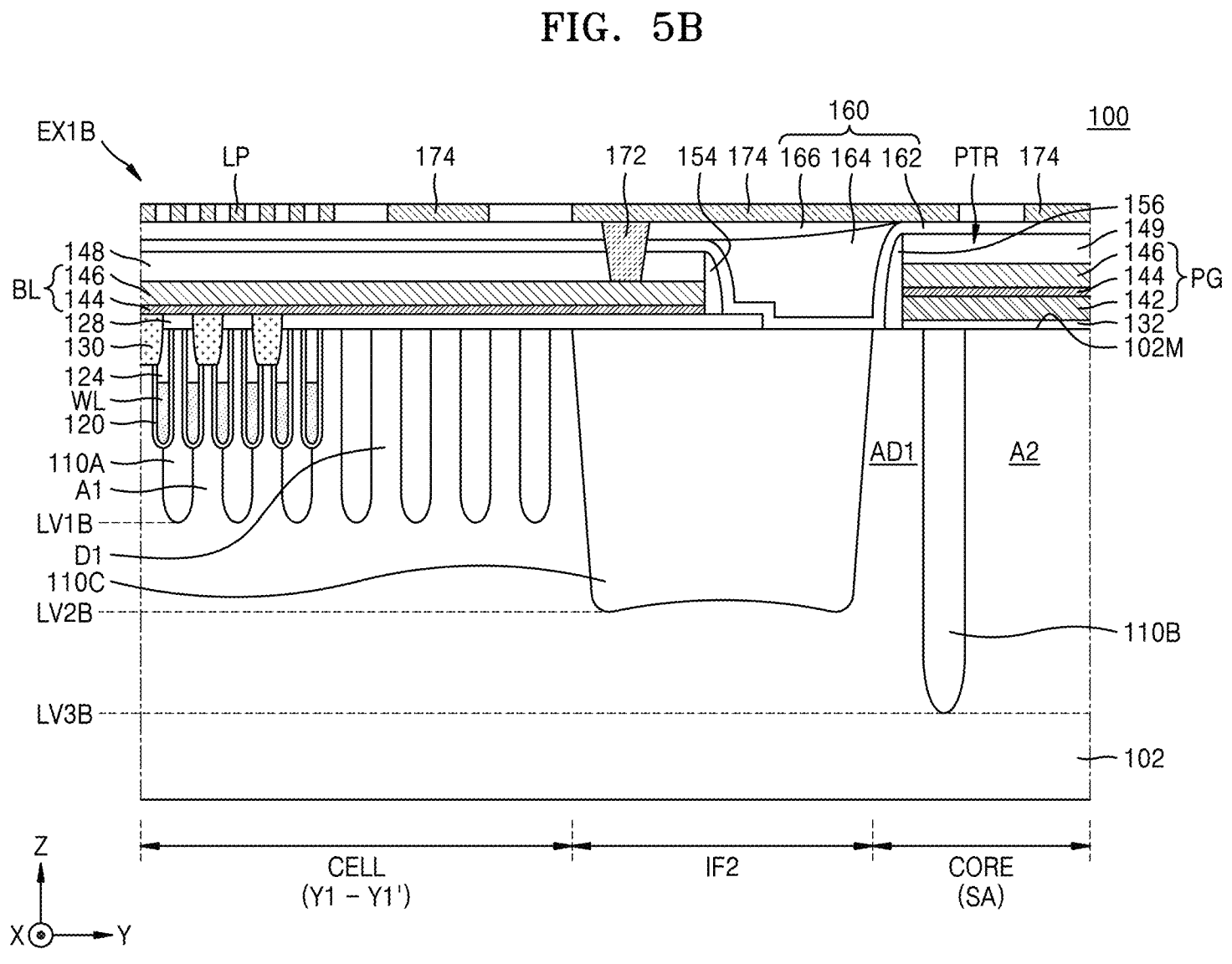
Figure 5C:
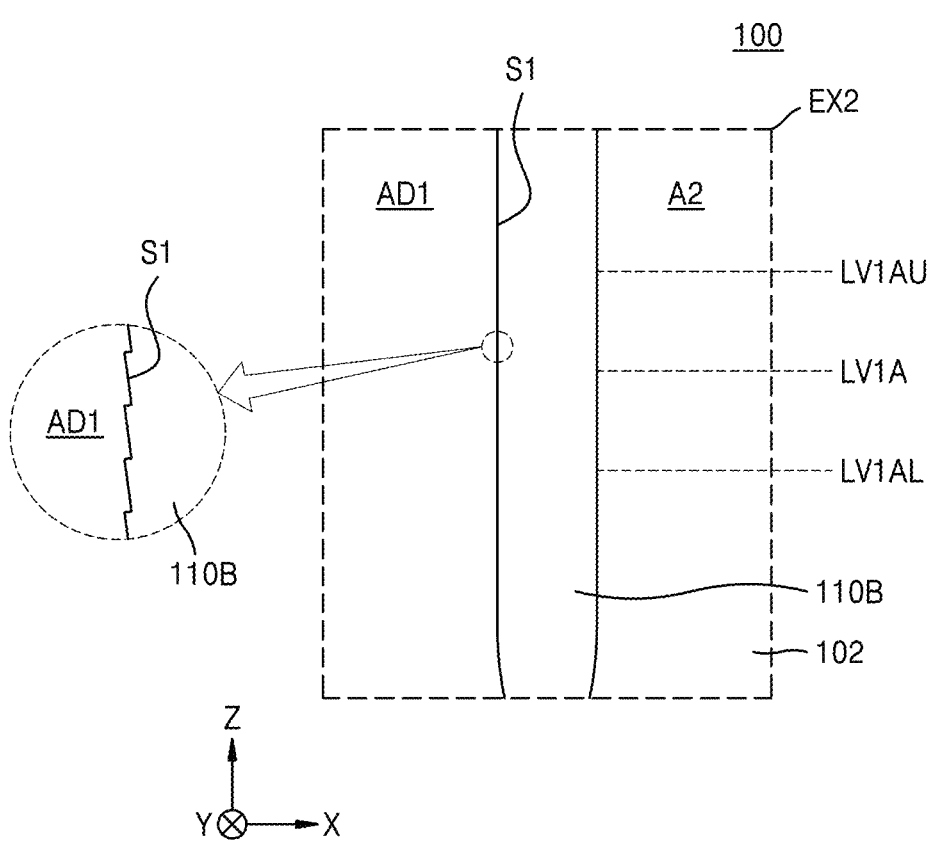
FIG. 5C is an enlarged cross-sectional view of a region EX2 of FIG. 5A.

FIG. 4 is an enlarged plan view of a region EX1 of FIG. 2, FIG. 5A is an enlarged cross-sectional view of a region EX1A of FIG. 4, and FIG. 5B is an enlarged cross-sectional view of a region EX1B of FIG. 4. FIG. 5A illustrates a cross-sectional configuration of a portion of the integrated circuit device 100, taken along a line X1-X1' of FIG. 3 and an extension line thereof, and FIG. 5B illustrates a cross-sectional configuration of a portion of the integrated circuit device 100, taken along a line Y1-Y1' of FIG. 3 and an extension line thereof. FIG. 5C is an enlarged cross-sectional view of a region EX2 of FIG. 5A.

Referring to FIGS. 4 and 5A to 5C, the integrated circuit device 100 may include a substrate 102. The substrate 102 may have a cell array area CELL, a peripheral circuit area including a core area CORE, and an interface area IF (see FIG. 4) between the cell array area CELL and the core area CORE. The core area CORE may correspond to the core area 30 shown in FIG. 4. The core area CORE may have a sub-word line driver area SWD, which is adjacent to the cell array area CELL in the first horizontal direction (the X direction), and a sense amplifier area SA, which is adjacent to the cell array area CELL in the second horizontal direction (the Y direction). The interface area IF may include a first interface area IF1 between the cell array area CELL and the sub-word line driver area SWD and a second interface area IF2 between the cell array area CELL and the sense amplifier area SA.

The substrate 102 may be formed of or include silicon, for example, single-crystal silicon, polycrystalline silicon, or amorphous silicon. In some embodiments, the substrate 102 may include at least one selected from Ge, SiGe, SiC, GaAs, InAs, and InP. In some embodiments, the substrate 102 may include a conductive region, for example, an impurity-doped well or an impurity-doped structure.

In the cell array area CELL, a cell device isolation film 110A may be arranged in the substrate 102. In the cell array area CELL, a plurality of cell active regions A1 and dummy cell active regions D1 may be defined in the substrate 102 by cell device isolation film 110A. In the peripheral circuit area including the core area CORE, a plurality of peripheral device isolation films 110B may be arranged in the substrate 102. The peripheral circuit area may correspond to the second area 24 shown in FIG. 1. In the peripheral circuit area including the core area CORE, a plurality of peripheral active regions A2 may be defined by the plurality of peripheral device isolation films 110B. In the first and second interface areas IF1 and IF2, an interface device isolation film 110C may be arranged in the substrate 102. The interface device isolation film 110C may arranged between the cell array area CELL and the core area CORE and may separate the cell array area CELL and the core area CORE from each other.

The cell device isolation film 110A may have various depths at various vertical levels LV1A and LV1B in a vertical direction (a Z direction) from an upper surface 102M of the substrate 102. The maximum depth of the cell device isolation film 110A may vary depending on positions thereof. For example, the cell device isolation film 110A may have the maximum depth at the vertical level LV1A shown in FIG. 5A or at the vertical level LV1B shown in FIG. 5B.

The plurality of peripheral device isolation films 110B arranged in the peripheral circuit area including the core area CORE may respectively have various depths at various vertical levels LV3A and LV3B in the vertical direction (the Z direction) from the upper surface 102M of the substrate 102. The maximum depth of each of the plurality of peripheral device isolation films 110B may vary depending on positions thereof. For example, each of the plurality of peripheral device isolation films 110B may have the maximum depth at the vertical level LV3A shown in FIG. 5A or at the vertical level LV3B shown in FIG. 5B. The depth of each of the plurality of peripheral device isolation films 110B may be greater than the depth of the cell device isolation film 110A. Therefore, the vertical distance from the vertical level LV3A or LV3B of the lowermost portion of each of the plurality of peripheral device isolation films 110B to the upper surface 102M of the substrate 102 may be greater than the vertical distance from the vertical level LV1A or LV2B of the lowermost portion of the cell device isolation film 110A to the upper surface 102M of the substrate 102.

In the first and second interface areas IF1 and IF2, the interface device isolation film 110C may have various depths at various vertical levels LV2A and LV2B in the vertical direction (the Z direction) from the upper surface 102M of the substrate 102. The maximum depth of the interface device isolation film 110C may vary depending on positions thereof. For example, the interface device isolation film 110C may have the maximum depth at the vertical level LV2A shown in FIG. 5A or at the vertical level LV2B shown in FIG. 5B. The depth of the interface device isolation film 110C may be greater than the depth of the cell device isolation film 110A and may be less than the depth of each of the plurality of peripheral device isolation films 110B. Therefore, the vertical distance from the vertical level LV2A or LV2B of the lowermost portion of the interface device isolation film 110C to the upper surface 102M of the substrate 102 may be greater than the vertical distance from the vertical level LV1A or LV2B of the lowermost portion of the cell device isolation film 110A to the upper surface 102M of the substrate 102 and may be less than the vertical distance from the vertical level LV3A or LV3B of the lowermost portion of each of the plurality of peripheral device isolation films 110B to the upper surface 102M of the substrate 102.

An active dam region AD1 may be arranged around the cell array area CELL to surround the cell array area CELL in a plan view. At least a portion of the active dam region AD1 may be arranged in the core area CORE. At least a portion of the active dam region AD1 may be apart from the cell array area CELL with the interface device isolation film 110C therebetween. FIGS. 4, 5A, and 5B illustrate a configuration in which all portions of the active dam region AD1 are apart from the cell array area CELL with the interface device isolation film 110C therebetween such that the active dam region AD1 surrounds the cell array area CELL.

As shown in FIG. 4, in a plan view, the active dam region AD1 may have a closed-loop traverse shape (e.g., a closed-loop shape) continuously surrounding the cell array area CELL without interruption. FIG. 4 illustrates an example in which the planar shape of the active dam region AD1 has a closed-loop traverse shape. However, the inventive concept is not limited thereto. The active dam region AD1 may have various planar shapes as needed.

The active dam region AD1 may include a local region (which may be referred to as a first local region) between the interface device isolation film 110C and a peripheral device isolation film 110B (which may be referred to as a first peripheral device isolation film), which is closest to the interface device isolation film 110C, among the plurality of peripheral device isolation films 110B in the sub-word line driver area SWD, as shown in FIG. 5A, and a local region (which may be referred to as a second local region) between the interface device isolation film 110C and a peripheral device isolation film 110B (which may be referred to as a second peripheral device isolation film), which is closest to the interface device isolation film 110C, among the plurality of peripheral device isolation films 110B in the sense amplifier area SA, as shown in FIG. 5B. In the active dam region AD1, the first local region and the second local region may be integrally connected to each other.

As shown in FIG. 5A, the first local region of the active dam region AD1 may be in contact with a sidewall of the interface device isolation film 110C, which faces the sub-word line driver area SWD. As shown in FIG. 5B, the second local region of the active dam region AD1 may be in contact with a sidewall of the interface device isolation film 110C, which faces the sense amplifier area SA.

As shown in FIG. 5C, a sidewall S1 of the active dam region AD1, which is defined by the peripheral device isolation film 110B, may extend unevenly in a depth direction of the active dam region AD1. This may be because, when a trench (for example, a second trench T2 shown in FIG. 14I) for defining the active dam region AD1 is formed in the substrate 102, the sidewall of the second trench T2 has an uneven surface by performing an etching process using a bosch process. Because the sidewall S1 of the active dam region AD1 includes an uneven surface, the sidewall of the peripheral device isolation film 110B, which is in contact with the sidewall S1 of the active dam region AD1, may also include an uneven surface.

As shown in FIG. 5C, the sidewall of the peripheral device isolation film 110B may extend with a substantially constant inclination without a substantial change in the sidewall extension-direction inclination of the peripheral device isolation film 110B in a range between a lower vertical level LV1AL, which is farther from the upper surface 102M of the substrate 102 than the vertical level LV1A or LV1B of the maximum depth of the cell device isolation film 110A, and an upper vertical level LV1AU, which is closer to the upper surface 102M of the substrate 102 than the vertical level LV1A or LV1B of the maximum depth of the cell device isolation film 110A. In some embodiments, a first vertical distance between the vertical level LV1A or LV1B of the maximum depth of the cell device isolation film 110A and the lower vertical level LV1AL, and a second vertical distance between the vertical level LV1A or LV1B of the maximum depth of the cell device isolation film 110A and the upper vertical level LV1AU may each be, but are not limited to, about 700 Å or less. For example, a vertical distance between a lowermost point of the cell device isolation film 110A and the lower vertical level LV1AL may be about 700 Å or less, and a vertical distance between a lowermost point of the cell device isolation film 110A and the upper vertical level LV1AU may be about 700 Å or less.

In some embodiments, the cell device isolation film 110A, the plurality of peripheral device isolation films 110B, and the interface device isolation film 110C may each be formed of or include a silicon oxide film, a silicon nitride film, a silicon oxynitride film, or a combination thereof. For example, in the cell array area CELL, a portion of the cell device isolation film 110A, which has a relatively small width in a horizontal direction (for example, the X direction or the Y direction), may include only a silicon oxide film, and a portion of the cell device isolation film 110A, which has a relatively large width in the horizontal direction, may include a silicon oxide film and a silicon nitride film surrounded by the silicon oxide film. The width of each of the plurality of peripheral device isolation films 110B and the interface device isolation film 110C in the horizontal direction may be greater than the width of the cell device isolation film 110A in the horizontal direction. Each of the plurality of peripheral device isolation films 110B and the interface device isolation film 110C may have a double-layer structure of silicon oxide film/silicon nitride film or a triple-layer structure of silicon oxide film/silicon nitride film/silicon oxide film.

As shown in FIGS. 5A and 5B, the integrated circuit device 100 may include a plurality of word lines WL at a vertical level that is lower than the vertical level of the upper surface 102M of the substrate 102 in the cell array area CELL, the plurality of word lines WL extending lengthwise in the first horizontal direction (the X direction) across the plurality of cell active regions A1. The plurality of word lines WL may extend parallel to each other. The lower surface and the sidewall of each of the plurality of word lines WL may be covered by a gate dielectric film 120, and the upper surface of each of the plurality of word lines WL may be covered by a buried insulating film 124. A plurality of recess spaces 124R may be formed in the upper surface of the buried insulating film 124. As shown in FIG. 5A, a portion of each of the word line WL, the gate dielectric film 120, and the buried insulating film 124 may extend to the first interface area IF1 in the first horizontal direction (the X direction).

As used herein, an item, layer, or portion of an item or layer described as "extending" or as extending "lengthwise" in a particular direction has a length in the particular direction and a width perpendicular to that direction, where the length is greater than the width.

In some embodiments, each of the plurality of word lines WL may be formed of or include, but is not limited to, Ti, TiN, Ta, TaN, W, WN, TiSiN, WSiN, or a combination thereof. The gate dielectric film 120 may be formed of or include a silicon oxide film, a silicon nitride film, a silicon oxynitride film, an oxide/nitride/oxide (ONO) film, or a high-k dielectric film having a dielectric constant that is higher than that of a silicon oxide film. For example, the gate dielectric film 120 may include, but is not limited to, $HfO_2$, $Al_2O_3$, $HfAlO_3$, $Ta_2O_3$, or $TiO_2$. The buried insulating film 124 may be formed of or include, but is not limited to, a silicon oxide film, a silicon nitride film, a silicon oxynitride film, or a combination thereof.

A buffer film 128 may be formed on the upper surface 102M of the substrate 102. The buffer film 128 may include a single-layered film or a multilayered film. The buffer film 128 may be formed of or include, but is not limited to, a silicon oxide film, a silicon nitride film, a silicon oxynitride film, a metal oxide film, or a combination thereof.

As shown in FIG. 5B, a plurality of direct contacts 130 may be arranged on the substrate 102. The plurality of direct contacts 130 may correspond to a plurality of direct contacts DC shown in FIG. 3. Each of the plurality of direct contacts 130 may be connected to one cell active region A1 selected from the plurality of cell active regions A1. Each of the plurality of direct contacts 130 may be formed of or include, but is not limited to, Si, Ge, W, WN, Co, Ni, Al, Mo, Ru, Ti, TiN, Ta, TaN, Cu, or a combination thereof.

A plurality of bit lines BL may extend lengthwise in the second horizontal direction (the Y direction) on or over the substrate 102 and the plurality of direct contacts 130. Each of the plurality of bit lines BL may be connected to the cell active region A1 via the direct contact 130. Each of the plurality of bit lines BL may include a first conductive pattern 144 and a second conductive pattern 146, which are stacked in the stated order over the substrate 102. Each of the first conductive pattern 144 and the second conductive pattern 146 may be formed of or include TiN, TiSiN, W, tungsten silicide, or a combination thereof. In some embodiments, the first conductive pattern 144 may include TIN, TiSiN, or a combination thereof and the second conductive pattern 146 may include W, but the inventive concept is not limited thereto. In some embodiments, each of the plurality of bit lines BL may further include a lower conductive pattern between the buffer film 128 and the first conductive pattern 144. The lower conductive pattern may be formed of or include doped polysilicon.

The upper surface of each of the plurality of bit lines BL may be covered by an insulating capping pattern 148. The sidewall of each of the bit line BL and the insulating capping pattern 148 may be covered by an insulating spacer 150. The insulating capping pattern 148 may be formed of or include a silicon nitride film. The insulating spacer 150 may be formed of or include a silicon oxide film, a silicon nitride film, an air spacer, or a combination thereof. As used herein, the term "air" may refer to the atmosphere or to other gases that may be present during a manufacturing process. The insulating spacer 150 may extend lengthwise in the second horizontal direction (the Y direction) and be parallel to the bit line BL.

A plurality of contact plugs and a plurality of insulating fences 152 may be arranged between each of the plurality of bit lines BL. The plurality of contact plugs and the plurality of insulating fences 152 may be alternately arranged one-by-one in the second horizontal direction (the Y direction) between two adjacent bit lines BL among the plurality of bit lines BL. The plurality of contact plugs may correspond to the plurality of buried contacts BC shown in FIG. 3. Each of the plurality of contact plugs may be configured to be electrically connected to one cell active region A1 selected from the plurality of cell active regions A1. The plurality of insulating fences 152 may be respectively arranged one-by-one between the plurality of contact plugs to respectively fill the plurality of recess spaces 124R formed in the upper surface of the buried insulating film 124. Both sidewalls of each of the plurality of contact plugs in terms of the second horizontal direction (the Y direction) may be covered by the plurality of insulating fences 152. Each of the plurality of contact plugs may be apart from the bit line BL in the first horizontal direction (the X direction) with the insulating spacer 150 therebetween. The plurality of contact plugs may each be formed of or include doped polysilicon. The plurality of insulating fences 152 may each be formed of or include a silicon nitride film.

As shown in FIG. 5A, in the first horizontal direction (the X direction), a dummy bit line DBL may be arranged between the plurality of bit lines BL and the core area CORE. The dummy bit line DBL may have substantially the same structure as the bit line BL described above. However, in the first horizontal direction (the X direction), the width of the dummy bit line DBL may be different from the width of the bit line BL. For example, in the first horizontal direction (the X direction), the width of the dummy bit line DBL may be greater than the width of the bit line BL. Similar to the bit line BL, the upper surface of the dummy bit line DBL may be covered by the insulating capping pattern 148. A sidewall of the dummy bit line DBL, which faces the core area CORE, may be covered by an insulating spacer 154. The insulating spacer 154 may be formed of or include, but is not limited to, a silicon nitride film.

As shown in FIGS. 5A and 5B, a plurality of peripheral transistors PTR may be arranged on the substrate 102 in the core area CORE. The plurality of peripheral transistors PTR may each include a gate dielectric film 132 on the substrate 102 and a peripheral gate PG on the gate dielectric film 132. The gate dielectric film 132 may be formed of or include a silicon oxide film, a high-k dielectric film, or a combination thereof. The high-k dielectric film may include, but is not limited to, $HfO_2$, $Al_2O_3$, $HfAlO_3$, $Ta_2O_3$, or $TiO_2$. The peripheral gate PG may include a lower conductive pattern 142, a first conductive pattern 144, and a second conductive pattern 146, which are stacked in the stated order on the gate dielectric film 132. The lower conductive pattern 142 may be formed of or include doped polysilicon. A constituent material of each of the first conductive pattern 144 and the second conductive pattern 146 is the same as described above. Each of the plurality of peripheral transistors PTR may further include a pair of source/drain regions, which are formed in the substrate 102 on both sides of the peripheral gate PG.

The upper surface of the peripheral gate PG may be covered by an insulating capping pattern 149. The sidewall of the peripheral gate PG may be covered by an insulating spacer 156. Each of the insulating capping pattern 149 and the insulating spacer 156 may be formed of or include, but is not limited to, a silicon nitride film.

In each of the cell array area CELL and the peripheral circuit area that includes the core area CORE, an insulating structure 160 may be arranged to cover the plurality of bit lines BL, the dummy bit line DBL, and the plurality of peripheral transistors PTR. The insulating structure 160 may include an insulating liner 162, which conformally covers lower structures including the plurality of bit lines BL, the dummy bit line DBL, and the plurality of peripheral transistors PTR in the cell array area CELL and the core area CORE; a gap-fill insulating film 164, which fills a space over the insulating liner 162 in the first and second interface areas IF1 and IF2; and a planarization insulating film 166, which covers the gap-fill insulating film 164. Each of the insulating liner 162, the gap-fill insulating film 164, and the planarization insulating film 166 may be formed of or include, but is not limited to, a silicon oxide film, a silicon nitride film, or a combination thereof.

An interlayer dielectric 176 may be arranged on the insulating structure 160, and a plurality of wiring structures configured to pass through the interlayer dielectric 176 in the vertical direction (the Z direction) and be respectively connected to conductive unit devices thereunder may be arranged over the insulating structure 160. The plurality of wiring structures may include a plurality of conductive landing pads LP, which are arranged over the plurality of bit lines BL in the cell array area CELL, and a plurality of wiring patterns 174 arranged in the first and second interface areas IF1 and IF2 and the core area CORE. Some of the plurality of plurality of wiring patterns 174 may be apart from the substrate 102 in the vertical direction (the Z direction) with the bit line BL therebetween.

As shown in FIG. 5A, a word line contact 170 may extend in the vertical direction (the Z direction) between one word line WL selected from the plurality of word lines WL and one wiring pattern 174 selected from the plurality of wiring patterns 174. The word line contact 170 may be configured to be electrically connected to each of the word line WL and the wiring pattern 174. The word line contact 170 may be in contact with the sidewall of the word line WL. In the first horizontal direction (the X direction), the active dam region AD1 may be arranged between a peripheral active region A2 closest to the word line contact 170, among the plurality of peripheral active regions A2, and the word line contact 170.

As shown in FIG. 5B, a bit line contact 172 may extend in the vertical direction (the Z direction) between one bit line BL selected from the plurality of bit lines BL and one wiring pattern 174 selected from the plurality of wiring patterns 174. The bit line contact 172 may be configured to be electrically connected to each of the bit line BL and the wiring pattern 174. The bit line contact 172 may be in contact with the upper surface of the bit line BL. In the second horizontal direction (the Y direction), the active dam region AD1 may be arranged between a peripheral active region A2, which is closest to the word line contact 170 among the plurality of peripheral active regions A2, and the bit line contact 172.

Each of the plurality of conductive landing pads LP, the plurality of wiring patterns 174, the word line contact 170, and the bit line contact 172 may include a conductive barrier film and a metal film on the conductive barrier film. In some embodiments, the conductive barrier film may be formed of or include a metal, a conductive metal nitride, or a combination thereof. For example, the conductive barrier film may include Ti/TiN. In some embodiments, the metal film may be formed of or include, but is not limited to, tungsten (W).

The integrated circuit device 100 described with reference to FIGS. 1 to 5C includes the active dam region AD1, which is formed in the substrate 102 in an area adjacent to the boundary between the cell array area CELL and the core area CORE adjacent to the cell array area CELL, and which surrounds the cell array area CELL. As a comparison example, in the case of an integrated circuit device not including the active dam region AD1, the substrate 102 may be vulnerable to warpage due to the interface device isolation film 110C occupying a relatively large area and a relatively large volume in the first and second interface areas IF1 and IF2. On the other hand, in the integrated circuit device 100 according to aspects of the inventive concept, the active dam region AD1 is arranged adjacent to the interface device isolation film 110C, thereby improving the warpage of the substrate 102. In addition, the cell device isolation film 110A in the cell array area CELL and the peripheral device isolation film 110B in the peripheral circuit area including the core area CORE may be formed with different depths by separate processes, respectively. Therefore, in the peripheral circuit area including the core area CORE, the peripheral device isolation film 110B having a greater depth than that in the cell array area CELL may be arranged. Therefore, even when the cross-sectional area of the peripheral active region A2 arranged in the peripheral circuit area is reduced, unit devices, for example, the plurality of peripheral transistors PTR, arranged in the peripheral circuit area may be prevented from suffering from issues due to breakdown voltage, leakage current, or the like, and the yield and reliability of the unit devices arranged in the peripheral circuit area may improve. In addition, by forming the peripheral device isolation film 110B having a relatively large depth in the peripheral circuit area, there is an advantage in reducing the area occupied by the peripheral circuit area, and thus, the integrated circuit device 100 having an advantageous structure for size reduction and larger capacity may be provided. Therefore, according to aspects of the inventive concept, in each of the cell array area CELL having a reduced area due to down-scaling and the peripheral circuit area including the core area CORE adjacent to the cell array area CELL, the integrated circuit device 100 having a structure capable of providing optimum electrical reliability depending on pattern densities and sizes may be provided.

Figure 6:
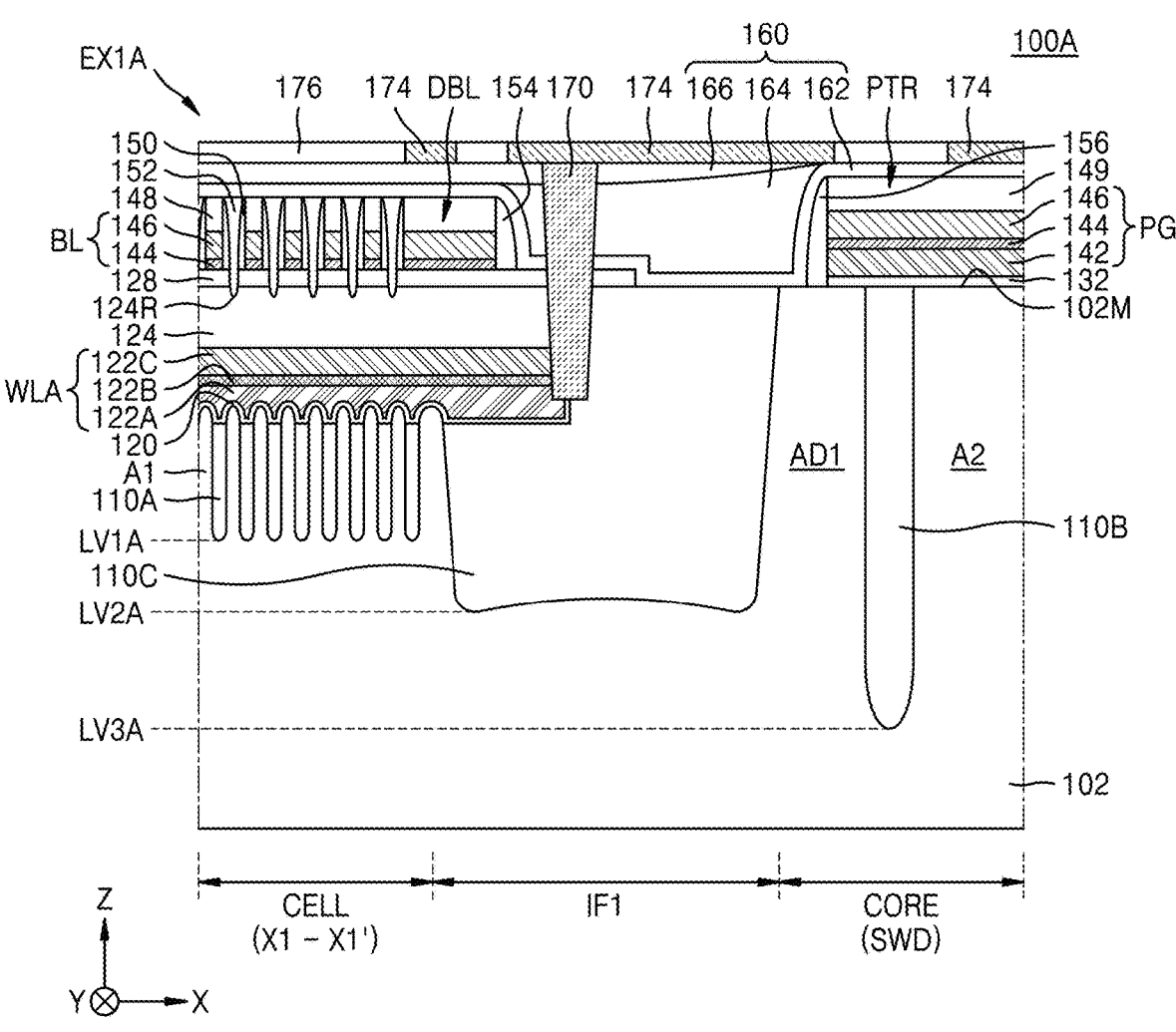
FIGS. 6 and 7 are cross-sectional views each illustrating an integrated circuit device according to some embodiments.
Figure 7:
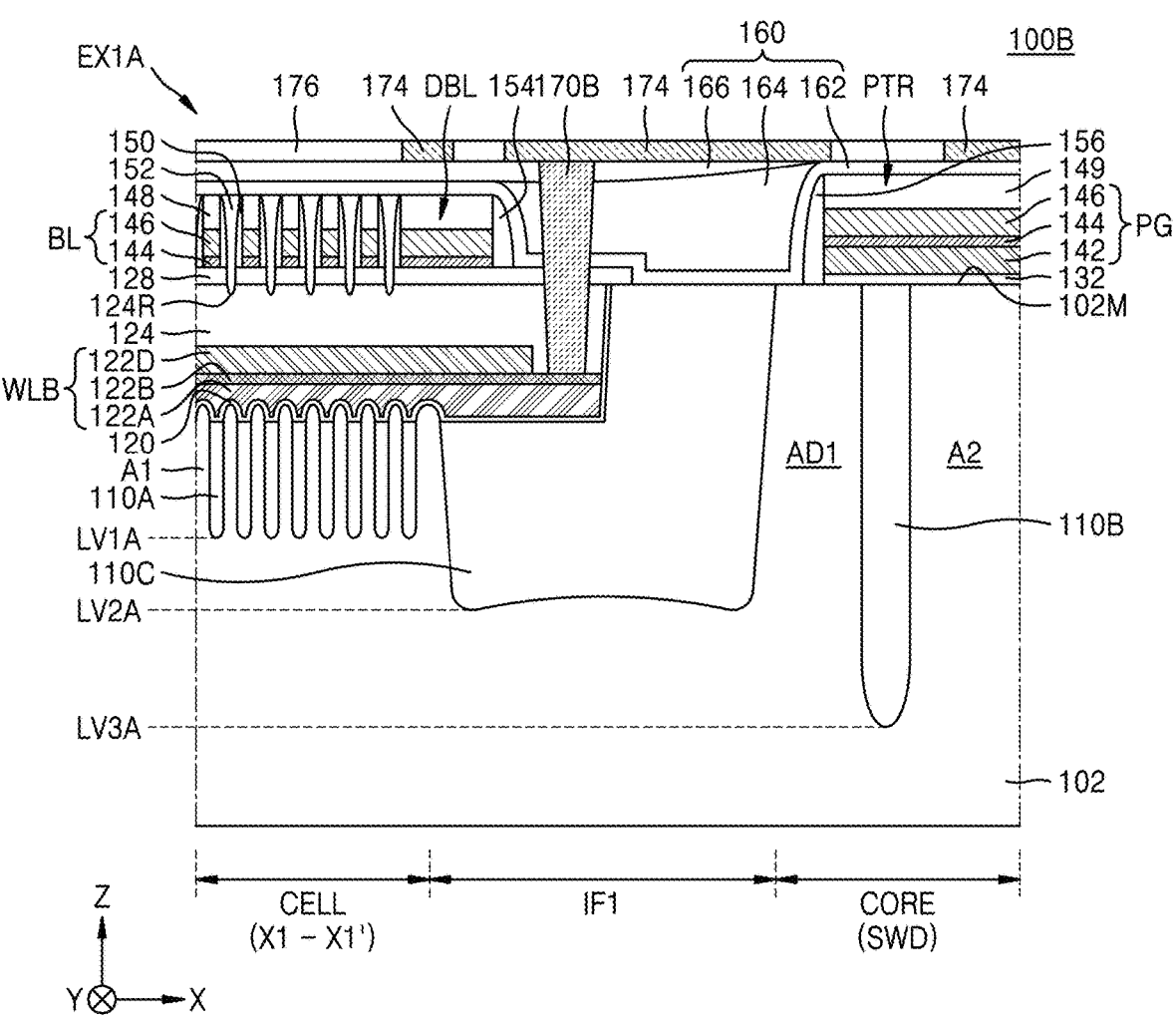

FIGS. 6 and 7 are cross-sectional views respectively illustrating integrated circuit devices 100A and 100B according to some embodiments. FIG. 6 illustrates an enlarged cross-sectional configuration of a portion of the integrated circuit device 100A, which corresponds to the region EX1A of FIG. 4A, and FIG. 7 illustrates an enlarged cross-sectional configuration of a portion of the integrated circuit device 100B, which corresponds to the region EX1A of FIG. 4A. In FIGS. 6 and 7, the same reference numerals as in FIGS. 1 to 5C respectively denote the same members, and here, repeated descriptions thereof are omitted.

Referring to FIG. 6, the integrated circuit device 100A has substantially the same configuration as the integrated circuit device 100 described with reference to FIGS. 1 to 5C. However, the integrated circuit device 100A includes a word line WLA. The word line WLA has substantially the same configuration as the word line WL described with reference to FIGS. 3, 5A, and 5B. However, the word line WLA includes a first conductive layer 122A, a second conductive layer 122B, and a third conductive layer 122C, which are stacked in the stated order on the gate dielectric film 120. The first conductive layer 122A, the second conductive layer 122B, and the third conductive layer 122C may respectively include different conductive materials.

In some embodiments, the first conductive layer 122A may be formed of or include a metal, a metal nitride, a metal carbide, or a combination thereof. For example, the first conductive layer 122A may include Ti, TiN, Ta, TaN, W, WN, TiSiN, WSIN, or a combination thereof. The second conductive layer 122B may be formed of or include a conductive material, a dielectric material, or a combination thereof. In one example, the second conductive layer 122B may include an oxide film including a metal, a nitride film including a metal, or a combination thereof. In another example, the second conductive layer 122B may include an oxide film including no metal, a nitride film including no metal, or a combination thereof. The third conductive layer 122C may be formed of or include doped polysilicon.

The word line contact 170 may be in contact with the sidewall of each of the first conductive layer 122A, the second conductive layer 122B, and the third conductive layer 122C, which are included in the word line WLA. In the first horizontal direction (the X direction), the active dam region AD1 may be arranged between the peripheral active region A2 closest to the word line contact 170, among the plurality of peripheral active regions A2, and the word line contact 170.

Referring to FIG. 7, the integrated circuit device 100B has substantially the same configuration as the integrated circuit device 100 described with reference to FIGS. 1 to 5C. However, the integrated circuit device 100B includes a word line WLB and a word line contact 170B.

The word line WLB has substantially the same configuration as the word line WL described with reference to FIGS. 3, 5A, and 5B. However, the word line WLB includes a first conductive layer 122A, a second conductive layer 122B, and a third conductive layer 122D, which are stacked in the stated order on the gate dielectric film 120. Respective constituent materials of the first conductive layer 122A and the second conductive layer 122B are the same as described with reference to FIG. 6. The third conductive layer 122D may have substantially the same configuration as the third conductive layer 122C described with reference to FIG. 6. However, in the first horizontal direction (the X direction), the length of the third conductive layer 122D may be less than the length of each of the first conductive layer 122A and the second conductive layer 122B.

The word line contact 170B has substantially the same configuration as the word line contact 170 described with reference to FIG. 5A. However, the word line contact 170B may be in contact with the upper surface of the second conductive layer 122B and may be apart from the third conductive layer 122D in the first horizontal direction (the X direction). A space between the word line contact 170B and the third conductive layer 122D may be filled with the buried insulating film 124.

In the first horizontal direction (the X direction), the active dam region AD1 may be arranged between the peripheral active region A2 closest to the word line contact 170B, among the plurality of peripheral active regions A2, and the word line contact 170B.

Figure 8:
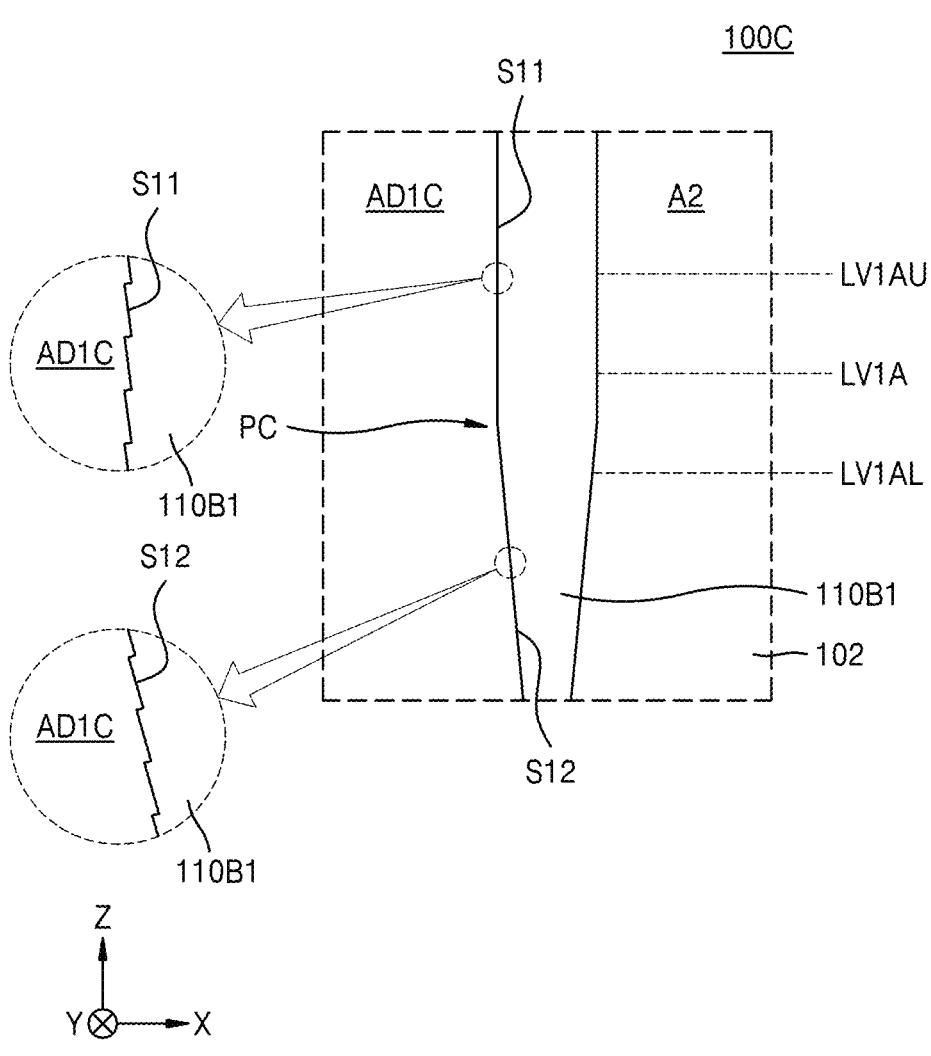
FIGS. 8 and 9 are cross-sectional views each illustrating an integrated circuit device according to some embodiments.
Figure 9:
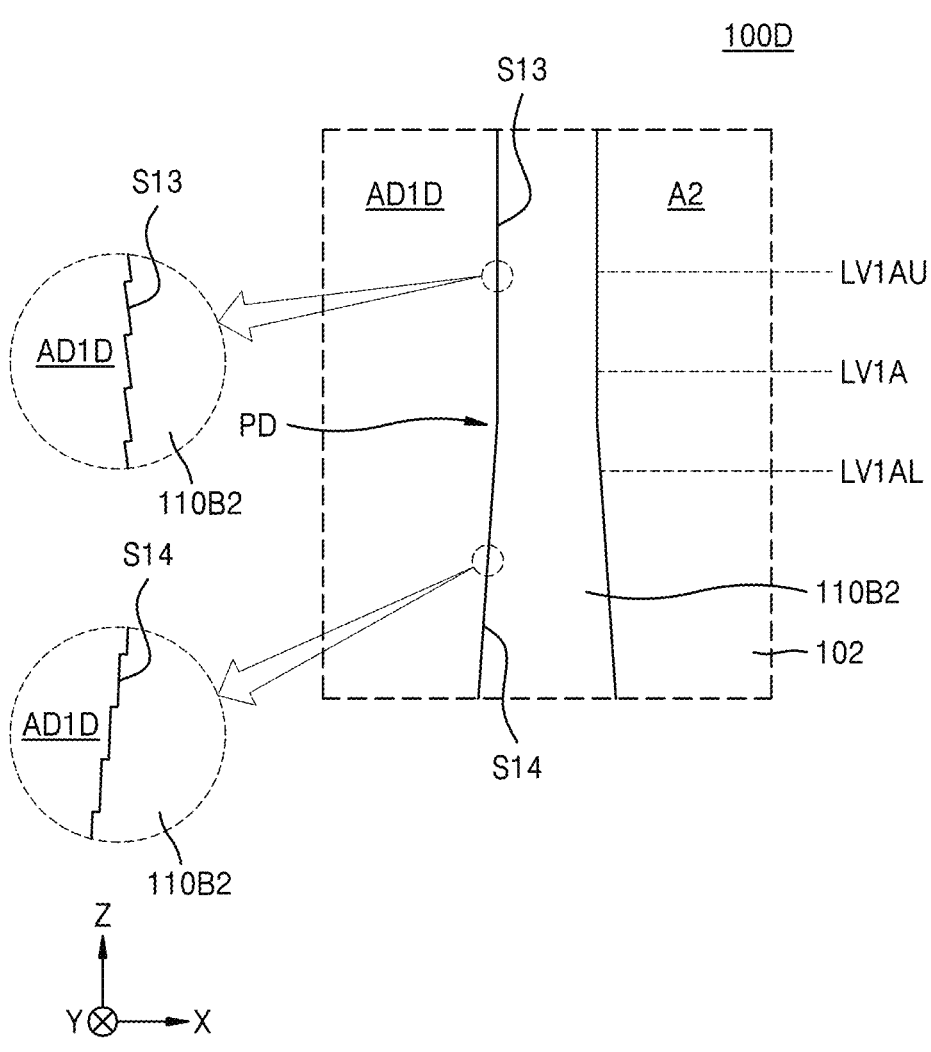

FIGS. 8 and 9 are cross-sectional views respectively illustrating integrated circuit devices 100C and 100D according to some embodiments. FIG. 8 illustrates an enlarged cross-sectional configuration of a portion of the integrated circuit device 100C, which corresponds to the region EX2 of FIG. 5A, and FIG. 9 illustrates an enlarged cross-sectional configuration of a portion of the integrated circuit device 100D, which corresponds to the region EX2 of FIG. 5A. In FIGS. 8 and 9, the same reference numerals as in FIGS. 1 to 5C respectively denote the same members, and here, repeated descriptions thereof are omitted.

Referring to FIG. 8, the integrated circuit device 100C has substantially the same configuration as the integrated circuit device 100 described with reference to FIGS. 1 to 5C. However, the integrated circuit device 100C includes an active dam region AD1C and a peripheral device isolation film 110B1 defining the active dam region AD1C.

The active dam region AD1C and the peripheral device isolation film 110B1 respectively have substantially the same configurations as the active dam region AD1 and the peripheral device isolation film 110B, which are described with reference to FIGS. 5A and 5B. However, sidewalls S11 and S12 of the active dam region AD1C defined by the peripheral device isolation film 110B1 may unevenly extend in a depth direction of the active dam region AD1C. This may be because, when a trench for defining the active dam region AD1C is formed in the substrate 102, the sidewall of the trench has an uneven surface by performing an etching process using a bosch process. Because each of the sidewalls S11 and S12 of the active dam region AD1C includes an uneven surface, the sidewall of the peripheral device isolation film 110B1, which is in contact with the sidewalls S11 and S12 of the active dam region AD1C, may also include an uneven surface.

In addition, the sidewall of the peripheral device isolation film 110B1 may include an inclination transition portion PC (e.g., a point at which the sidewall S11 transitions to the sidewall S12). A portion of the sidewall of the peripheral device isolation film 110B1, which is in contact with the sidewall S11 of the active dam region AD1C, may be an upper sidewall portion (e.g., an upper sidewall) closer to the upper surface 102M of the substrate 102 than the inclination transition portion PC (e.g., the upper sidewall portion is between the upper surface 102M of the substrate 102 and the inclination transition portion PC of the sidewall), and a portion of the sidewall of the peripheral device isolation film 110B1, which is in contact with the sidewall S12 of the active dam region AD1C, may be a lower sidewall portion (e.g., a lower sidewall) farther from the upper surface 102M of the substrate 102 than the inclination transition portion PC (e.g., the inclination transition portion PC is between the upper surface 102M of the substrate 102 and the lower sidewall portion). The upper sidewall portion and the lower sidewall portion of the sidewall of the peripheral device isolation film 110B1 may respectively have different inclinations.

More specifically, as shown in FIG. 5A, the maximum depth of the cell device isolation film 110A may be at the vertical level LV1A, and the inclination transition portion PC of the sidewall of the peripheral device isolation film 110B1 may be at a position selected from a range between the lower vertical level LV1AL, which is farther from the upper surface 102M of the substrate 102 than the vertical level LV1A, and the upper vertical level LV1AU, which is closer to the upper surface 102M of the substrate 102 than the vertical level LV1A. A first vertical distance between the vertical level LV1A of the maximum depth of the cell device isolation film 110A and the lower vertical level LV1AL and a second vertical distance between the vertical level LV1A of the maximum depth of the cell device isolation film 110A and the upper vertical level LV1AU may each be, but are not limited to, about 700 Å or less. For example, a vertical distance between the inclination transition portion PC and the vertical level LV1A of the maximum depth of the cell device isolation film 110A may be about 700 Å or less. The inclination transition portion PC may be above or below the vertical level LV1A.

In the integrated circuit device 100C shown in FIG. 8, the upper sidewall portion (that is, the portion contacting the sidewall S11 of the active dam region AD1C) of the sidewall of the peripheral device isolation film 110B1, which is closer to the upper surface 102M of the substrate 102 than the inclination transition portion PC, may extend in a direction having a first angle with respect to the vertical direction (the Z direction). The lower sidewall portion (that is, the portion contacting the sidewall S12 of the active dam region AD1C) of the sidewall of the peripheral device isolation film 110B1, which is farther from the upper surface 102M of the substrate 102 than the inclination transition portion PC, may extend in a direction having a second angle with respect to the vertical direction (the Z direction), the second angle being greater than the first angle. For example, the portion of the peripheral device isolation film 110B1 above the inclination transition portion PC may have straight vertical walls or may narrow from top to bottom, and the portion of the peripheral device isolation film 110B1 below the inclination transition portion PC may narrow more quickly from top to bottom than the portion of the peripheral device isolation film 110B1 above the inclination transition portion PC.

Referring to FIG. 9, the integrated circuit device 100D has substantially the same configuration as the integrated circuit device 100 described with reference to FIGS. 1 to 5C. However, the integrated circuit device 100D includes an active dam region AD1D and a peripheral device isolation film 110B2 defining the active dam region AD1D.

The active dam region AD1D and the peripheral device isolation film 110B2 respectively have substantially the same configurations as the active dam region AD1 and the peripheral device isolation film 110B, which are described with reference to FIGS. 5A and 5B. However, similar to the sidewalls S11 and S12 of the active dam region AD1C, which are described with reference to FIG. 8, sidewalls S13 and S14 of the active dam region AD1D defined by the peripheral device isolation film 110B2 may extend unevenly in a depth direction of the active dam region AD1D.

In addition, the sidewall of the peripheral device isolation film 110B2 may include an inclination transition portion PC. A portion of the sidewall of the peripheral device isolation film 110B2, which is in contact with the sidewall S13 of the active dam region AD1D, may be an upper sidewall portion closer to the upper surface 102M of the substrate 102 than the inclination transition portion PC (e.g., the upper sidewall portion is between the upper surface 102M of the substrate 102 and the inclination transition portion PC of the sidewall), and a portion of the sidewall of the peripheral device isolation film 110B2, which is in contact with the sidewall S14 of the active dam region AD1D, may be a lower sidewall portion farther from the upper surface 102M of the substrate 102 than the inclination transition portion PC (e.g., the inclination transition portion PC is between the upper surface 102M of the substrate 102 and the lower sidewall portion). The upper sidewall portion and the lower sidewall portion of the sidewall of the peripheral device isolation film 110B2 may respectively have different inclinations.

More specifically, as shown in FIG. 5A, the maximum depth of the cell device isolation film 110A may be at the vertical level LV1A, and the inclination transition portion PC of the sidewall of the peripheral device isolation film 110B2 may be at a position selected from a range between the lower vertical level LV1AL, which is farther from the upper surface 102M of the substrate 102 than the vertical level LV1A, and the upper vertical level LV1AU, which is closer to the upper surface 102M of the substrate 102 than the vertical level LV1A. A first vertical distance between the vertical level LV1A of the maximum depth of the cell device isolation film 110A and the lower vertical level LV1AL and a second vertical distance between the vertical level LV1A of the maximum depth of the cell device isolation film 110A and the upper vertical level LV1AU may each be, but are not limited to, about 700 Å or less. For example, a vertical distance between the inclination transition portion PC and the vertical level LV1A of the maximum depth of the cell device isolation film 110A may be about 700 Å or less. The inclination transition portion PC may be above or below the vertical level LV1A.

In the integrated circuit device 100D shown in FIG. 9, the upper sidewall portion (that is, the portion contacting the sidewall S13 of the active dam region AD1D) of the sidewall of the peripheral device isolation film 110B2, which is closer to the upper surface 102M of the substrate 102 than the inclination transition portion PC, may extend in a direction having a third angle with respect to the vertical direction (the Z direction). The lower sidewall portion (that is, the portion contacting the sidewall S14 of the active dam region AD1D) of the sidewall of the peripheral device isolation film 110B2, which is farther from the upper surface 102M of the substrate 102 than the inclination transition portion PC, may extend in a direction having a fourth angle with respect to the vertical direction (the Z direction), the fourth angle being formed in opposition to the third angle. The magnitude of the absolute value of the third angle may be equal to or different from the magnitude of the absolute value of the fourth angle. In one example, the magnitude of the absolute value of the third angle may be less than the magnitude of the absolute value of the fourth angle. In another example, the magnitude of the absolute value of the third angle may be greater than the magnitude of the absolute value of the fourth angle. For example, the portion of the peripheral device isolation film 110B2 above the inclination transition portion PC may have straight vertical walls or may narrow from top to bottom, and the portion of the peripheral device isolation film 110B2 below the inclination transition portion PC may widen from top to bottom.

Figure 10:
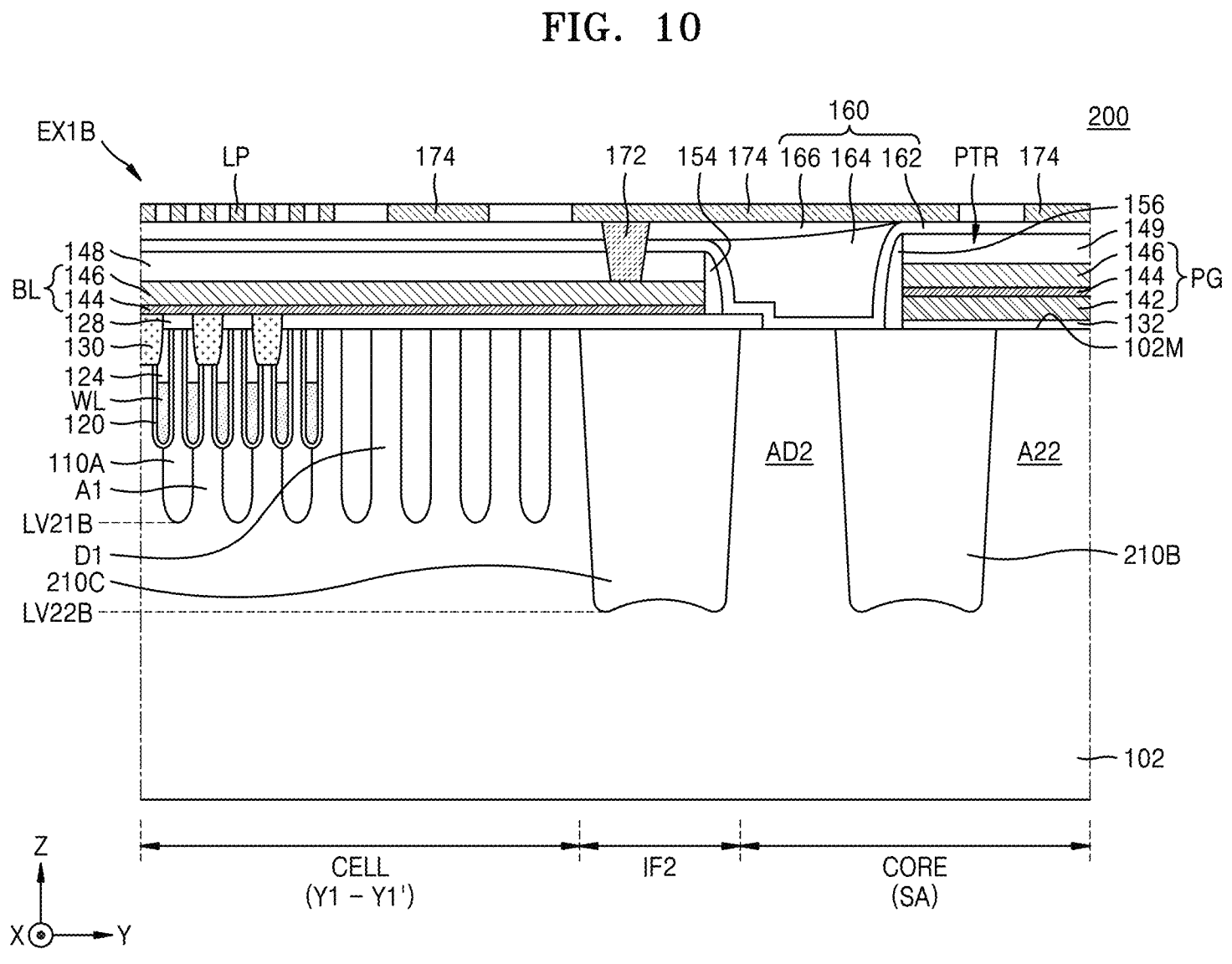

FIG. 10 is a cross-sectional view illustrating an integrated circuit device 200 according to some embodiments. FIG. 10 illustrates an enlarged cross-sectional configuration of a portion of the integrated circuit device 200, which corresponds to the region EX1B of FIG. 4A. In FIG. 10, the same reference numerals as in FIGS. 1 to 5C respectively denote the same members, and here, repeated descriptions thereof are omitted.

Referring to FIG. 10, the integrated circuit device 200 has substantially the same configuration as the integrated circuit device 100 described with reference to FIGS. 1 to 5C. However, in the integrated circuit device 200, a peripheral device isolation film 210B may be arranged in the substrate 102 in the peripheral circuit area including the core area CORE. A peripheral active region A22 may be defined by the peripheral device isolation film 210B in the peripheral circuit area including the core area CORE. An interface device isolation film 210C may be arranged in the substrate 102 in the second interface area IF2. An active dam region AD2 may be defined by the peripheral device isolation film 210B and the interface device isolation film 210C. The width of the active dam region AD2 in the second horizontal direction (the Y direction) may be determined by the peripheral device isolation film 210B and the interface device isolation film 210C.

More detailed configurations of the peripheral device isolation film 210B, the peripheral active region A22, the interface device isolation film 210C, and the active dam region AD2 are respectively and substantially the same as those of the peripheral device isolation film 110B, the peripheral active region A2, the interface device isolation film 110C, and the active dam region AD1, which are described with reference to FIGS. 5A and 5B. However, the depth of the peripheral device isolation film 210B in the vertical direction (the Z direction) may be equal or similar to the depth of the interface device isolation film 210C in the vertical direction (the Z direction). A vertical level LV22B of the lowermost portion of each of the peripheral device isolation film 210B and the interface device isolation film 210C in the vertical direction (the Z direction) may be farther from the upper surface 102M of the substrate 102 than a vertical level LV21B of the lowermost portion of the cell device isolation film 110A arranged in the cell array area CELL. In addition, in the second horizontal direction (the Y direction), the width of the peripheral device isolation film 210B may be equal or similar to the width of the interface device isolation film 210C.

Figure 11:
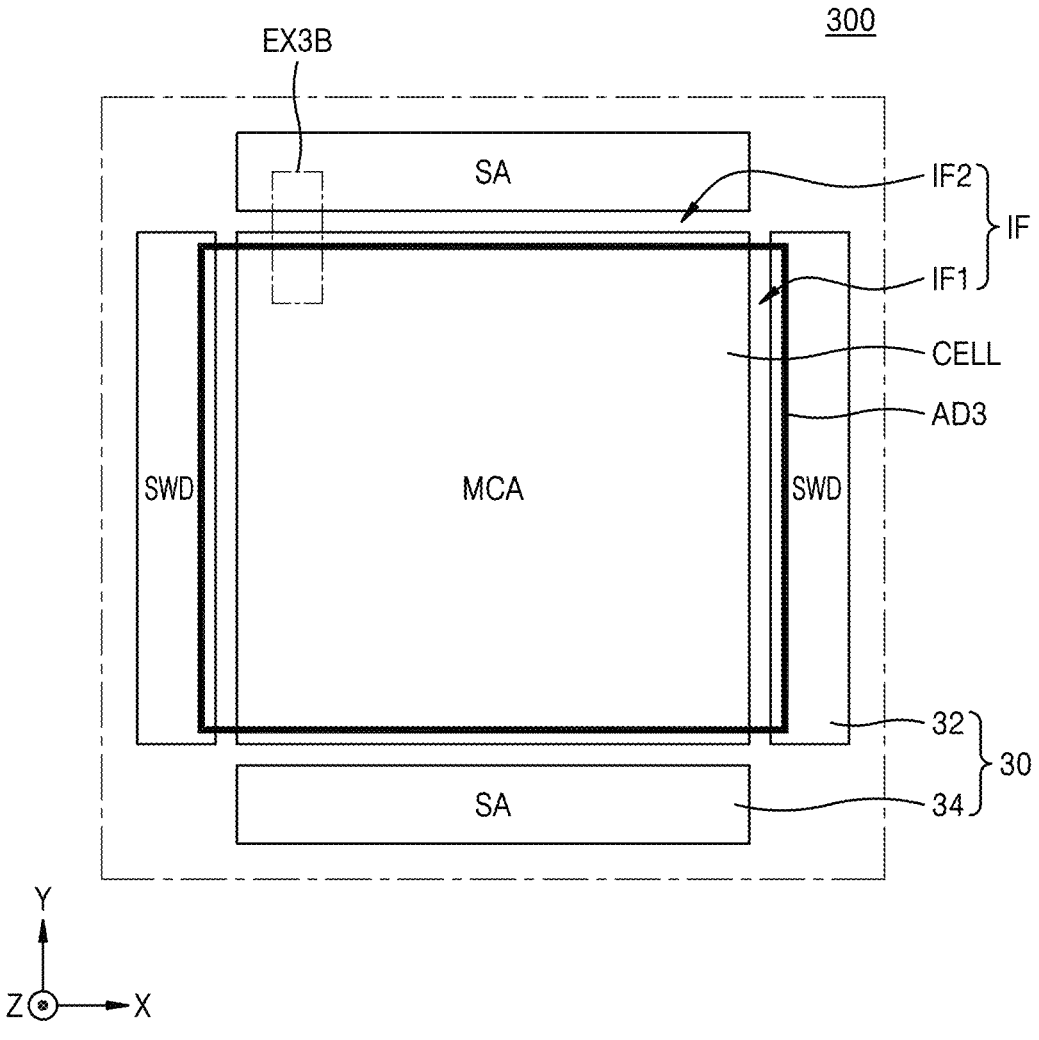
FIG. 11 is a plan view illustrating an integrated circuit device according to some embodiments.

FIG. 11 is a plan view illustrating an integrated circuit device 300 according to some embodiments. FIG. 11 illustrates a planar configuration of a portion of the integrated circuit device 300, which corresponds to the region EX1 of FIG. 2. In FIG. 11, the same reference numerals as in FIG. 4 respectively denote the same members, and here, repeated descriptions thereof are omitted.

Referring to FIG. 11, the integrated circuit device 300 has substantially the same configuration as the integrated circuit device 100 described with reference to FIGS. 1 to 5C. However, the integrated circuit device 300 includes an active dam region AD3.

The active dam region AD3 has substantially the same configuration as the active dam region AD1 described with reference to FIGS. 4, 5A, and 5B. In a plan view, the active dam region AD3 may be arranged around the cell array area CELL and may surround the cell array area CELL. In a plan view, the active dam region AD3 may have a closed-loop traverse shape (e.g., a closed-loop shape) continuously surrounding the cell array area CELL without interruption. However, a portion of the active dam region AD3 may be arranged in the core area CORE and another portion of the active dam region AD3 may be arranged in the cell array area CELL. The active dam region AD3 may include a portion arranged in the sub-word line driver area SWD and a portion arranged in the cell array area CELL.

FIGS. 12 and 13 are cross-sectional views respectively illustrating integrated circuit devices 300A and 300B according to some embodiments. FIG. 12 illustrates an enlarged cross-sectional configuration of a portion of the integrated circuit device 300A, which corresponds to a region EX3B of FIG. 11, and FIG. 13 illustrates an enlarged cross-sectional configuration of a portion of the integrated circuit device 300B, which corresponds to the region EX3B of FIG. 11. In FIGS. 12 and 13, the same reference numerals as in FIGS. 1 to 11 respectively denote the same members, and here, repeated descriptions thereof are omitted.

Referring to FIG. 12, the integrated circuit device 300A has substantially the same configuration as the integrated circuit device 100 described with reference to FIGS. 1 to 5C. However, the integrated circuit device 300A includes an active dam region AD3A.

The active dam region AD3A has substantially the same configuration as the active dam region AD1 described with reference to FIGS. 4, 5A, and 5B. In a plan view, the active dam region AD3A may be arranged around the cell array area CELL to surround the cell array area CELL. In a plan view, the active dam region AD3A may have a closed-loop traverse shape (e.g., a closed-loop shape) continuously surrounding the cell array area CELL without interruption. However, a portion of the active dam region AD3A may be arranged in the core area CORE and another portion of the active dam region AD3A may be arranged in the cell array area CELL. Similar to the active dam region AD3 shown in FIG. 11, the active dam region AD3A may include a portion arranged in the sub-word line driver area SWD and a portion arranged in a portion of the cell array area CELL, which is adjacent to the sense amplifier area SA.

Similar to the active dam region AD1 of the integrated circuit device 100, which is described with reference to FIG. 5A, the active dam region AD3A of the integrated circuit device 300A may include a local region (which may be referred to as a first local region) between the interface device isolation film 110C and a peripheral device isolation film 110B (which may be referred to as a first peripheral device isolation film), which is closest to the interface device isolation film 110C, among the plurality of peripheral device isolation films 110B in the sub-word line driver area SWD and a local region (which may be referred to as a second local region) between an interface device isolation film 310C1 and a portion of the cell device isolation film 110A, which is closest to the interface device isolation film 310C1 while located in the cell array area CELL to face the sense amplifier area SA in the second horizontal direction (the Y direction). The second local region of the active dam region AD3A and the bit line contact 172 may overlap each other in the vertical direction (the Z direction).

Referring to FIG. 13, the integrated circuit device 300B has substantially the same configuration as the integrated circuit device 100 described with reference to FIGS. 1 to 5C. However, the integrated circuit device 300B includes an active dam region AD3B.

The active dam region AD3B has substantially the same configuration as the active dam region AD1 described with reference to FIGS. 4, 5A, and 5B. In a plan view, the active dam region AD3B may be arranged around the cell array area CELL to surround the cell array area CELL. In a plan view, the active dam region AD3B may have a closed-loop traverse shape (e.g., a closed-loop shape) continuously surrounding the cell array area CELL without interruption. However, a portion of the active dam region AD3B may be arranged in the core area CORE and another portion of the active dam region AD3B may be arranged in the cell array area CELL. Similar to the active dam region AD3 shown in FIG. 11, the active dam region AD3B may include a portion arranged in the sub-word line driver area SWD and a portion arranged in a portion of the cell array area CELL, which is adjacent to the sense amplifier area SA.

Similar to the active dam region AD1 of the integrated circuit device 100, which is described with reference to FIG. 5A, the active dam region AD3B of the integrated circuit device 300B may include a local region (which may be referred to as a first local region) between the interface device isolation film 110C and a peripheral device isolation film 110B (which may be referred to as a first peripheral device isolation film), which is closest to the interface device isolation film 110C, among the plurality of peripheral device isolation films 110B in the sub-word line driver area SWD and a local region (which may be referred to as a second local region) between an interface device isolation film 310C2 and a portion of the cell device isolation film 110A, which is closest to the interface device isolation film 310C2 while located in the cell array area CELL to face the sense amplifier area SA in the second horizontal direction (the Y direction). The second local region of the active dam region AD3B may be closer to the cell array area CELL than the bit line contact 172. In the second horizontal direction (the Y direction), the active dam region AD3B may be arranged between the plurality of cell active regions A1 and the bit line contact 172.

Similar to the integrated circuit device 100 described with reference to FIGS. 1 to 5C, each of the integrated circuit devices 100A, 100B, 100C, 100D, 200, 300, 300A, and 300B described with reference to FIGS. 6 to 13 may include the active dam region AD1, AD1C, AD1D, AD2, AD3, AD3A, or AD3B formed in the substrate 102 in an area adjacent to the boundary between the cell array area CELL and the core area CORE adjacent to the cell array area CELL and surrounding the cell array area CELL, thereby improving the warpage of the substrate 102. In addition, because the peripheral device isolation film 110B, 110B1, or 110B2, which has a depth greater than that in the cell array area CELL, is arranged in the peripheral circuit area including the core area CORE, even when the area of the peripheral active region A2 arranged in the peripheral circuit area is reduced, unit devices, for example, the plurality of peripheral transistors PTR, arranged in the peripheral circuit area may be prevented from suffering from issues due to breakdown voltage, leakage current, or the like, and the yield and reliability of the unit devices arranged in the peripheral circuit area may improve. Furthermore, by forming the peripheral device isolation film 110B, 110B1, or 110B2 having a relatively large depth in the peripheral circuit area, there is an advantage in reducing the area occupied by the peripheral circuit area, and thus, the integrated circuit devices 100A, 100B, 100C, 100D, 200, 300, 300A, and 300B each having an advantageous structure for size reduction and larger capacity may be provided. Therefore, according to aspects of the inventive concept, in each of the cell array area CELL having a reduced area due to down-scaling and the peripheral circuit area including the core area CORE adjacent to the cell array area CELL, the integrated circuit devices 100A, 100B, 100C, 100D, 200, 300, 300A, and 300B each having a structure capable of providing optimum electrical reliability depending on pattern densities and sizes may be provided.

Next, methods of manufacturing integrated circuit devices according to some embodiments are described in detail.

FIGS. 14A to 21B are cross-sectional views illustrating a sequence of processes of an example of a method of manufacturing an integrated circuit device, according to some embodiments. More specifically, FIGS. 14A to 14I, 15A, 16A, 17A, 18A, 19A, 20A, and 21A each illustrate a cross-sectional configuration of a portion of the integrated circuit device, which corresponds to the region EX1A of FIG. 4, according to the sequence of processes, and FIGS. 15B, 16B, 17B, 18B, 19B, 20B, and 21B each illustrate a cross-sectional configuration of a portion of the integrated circuit device, which corresponds to the region EX1B of FIG. 4, according to the sequence of processes. An example of a method of manufacturing the integrated circuit device 100 shown in FIGS. 5A to 5C is described with reference to FIGS. 14A to 21B. In FIGS. 14A to 21B, the same reference numerals as in FIGS. 1 to 5C respectively denote the same members, and here, repeated descriptions thereof are omitted.

Figure 14A:
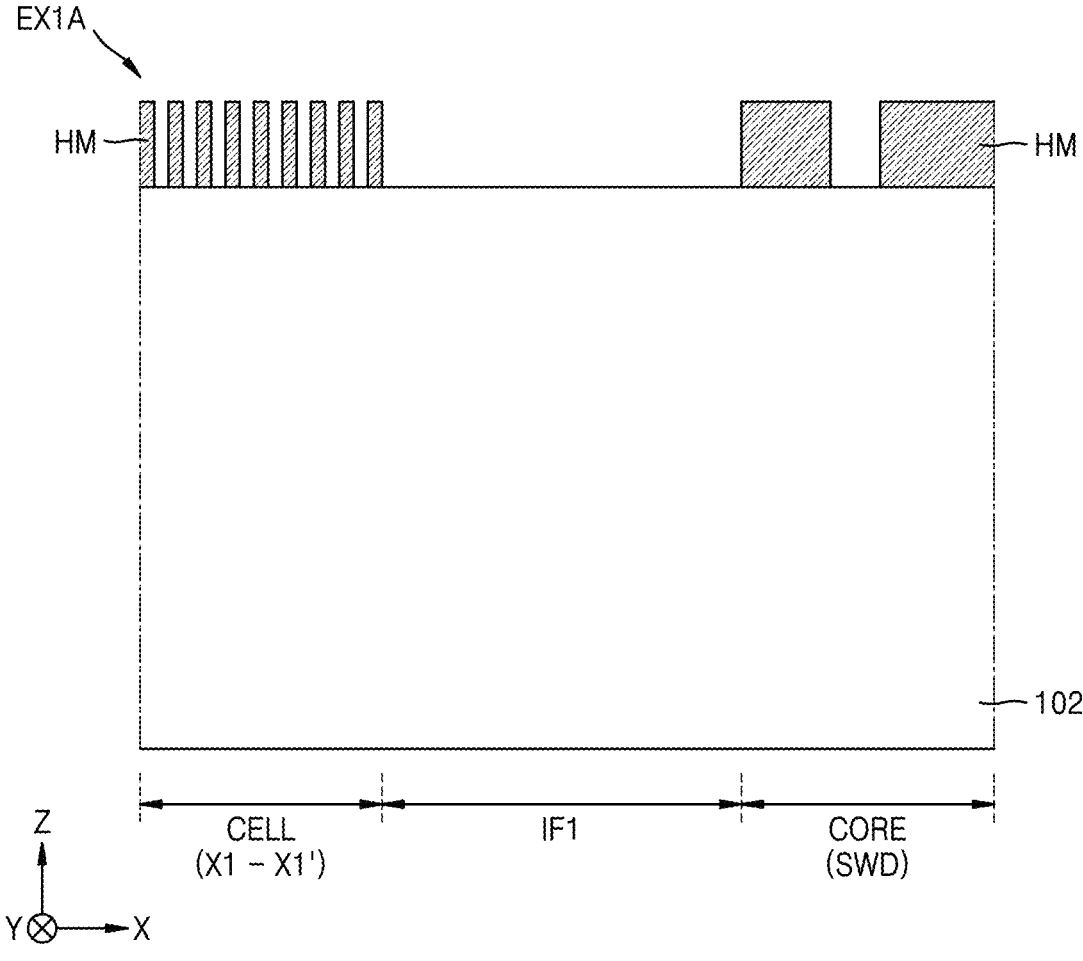

Referring to FIG. 14A, a hardmask pattern HM may be formed on the substrate 102. Some portions of the substrate 102 may be exposed by the hardmask pattern HM.

The hardmask pattern HM may have a single-layered or multilayered structure including a silicon oxide film, a silicon nitride film, a spin-on-hardmask (SOH) film, an amorphous carbon layer (ACL), a polysilicon film, or a combination thereof. In some embodiments, the hardmask pattern HM may include a silicon oxide film and a polysilicon film, which are stacked in the stated order on the substrate 102.

Figure 14B:
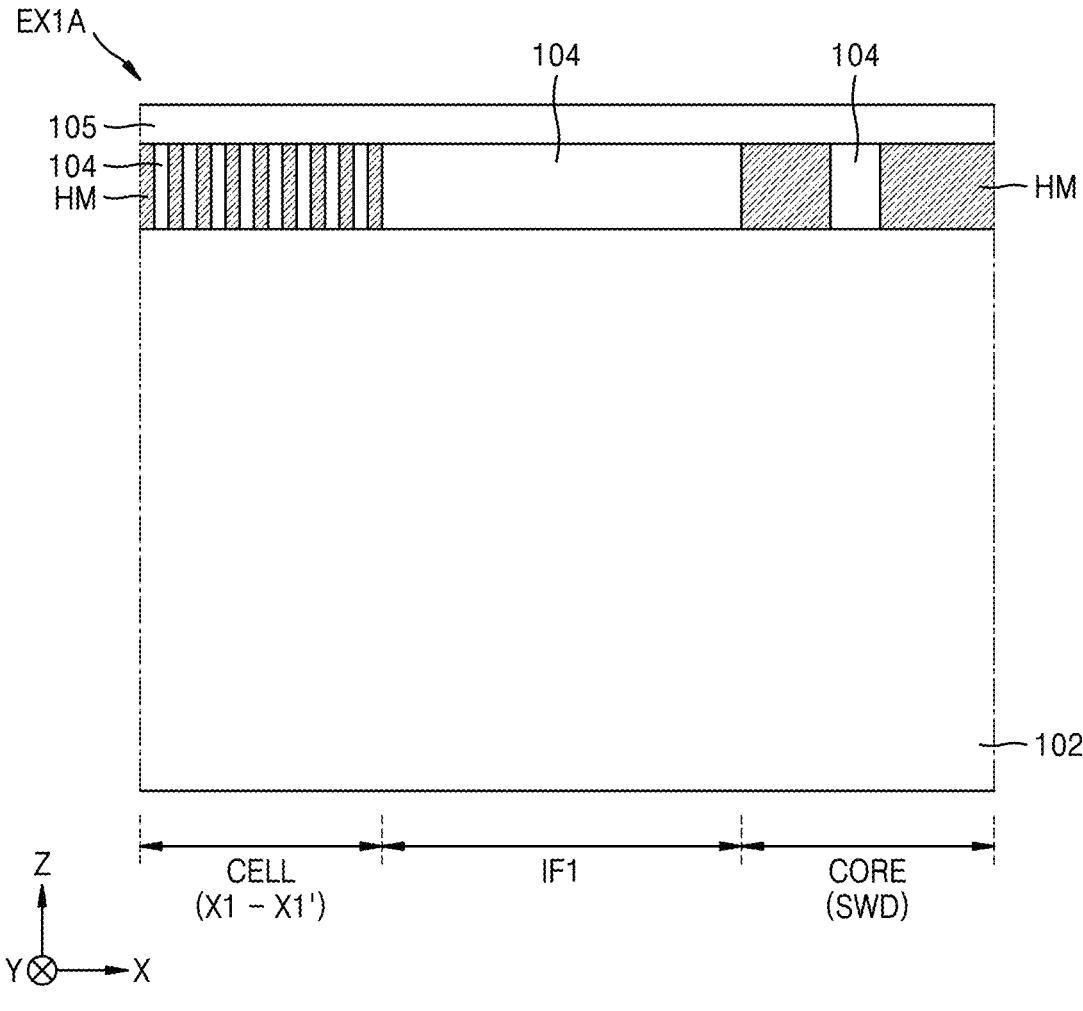

Referring to FIG. 14B, a protective mask pattern 104 may be formed on the resulting product of FIG. 14A to cover the portion of the substrate 102 exposed by the hardmask pattern HM, and a capping mask layer 105 may be formed to cover the upper surface of each of the hardmask pattern HM and the protective mask pattern 104.

In some embodiments, when the hardmask pattern HM includes a silicon oxide film and a polysilicon film, the protective mask pattern 104 may include an SOH film and the capping mask layer 105 may include a silicon oxide film, but the inventive concept is not limited thereto.

Figure 14C:
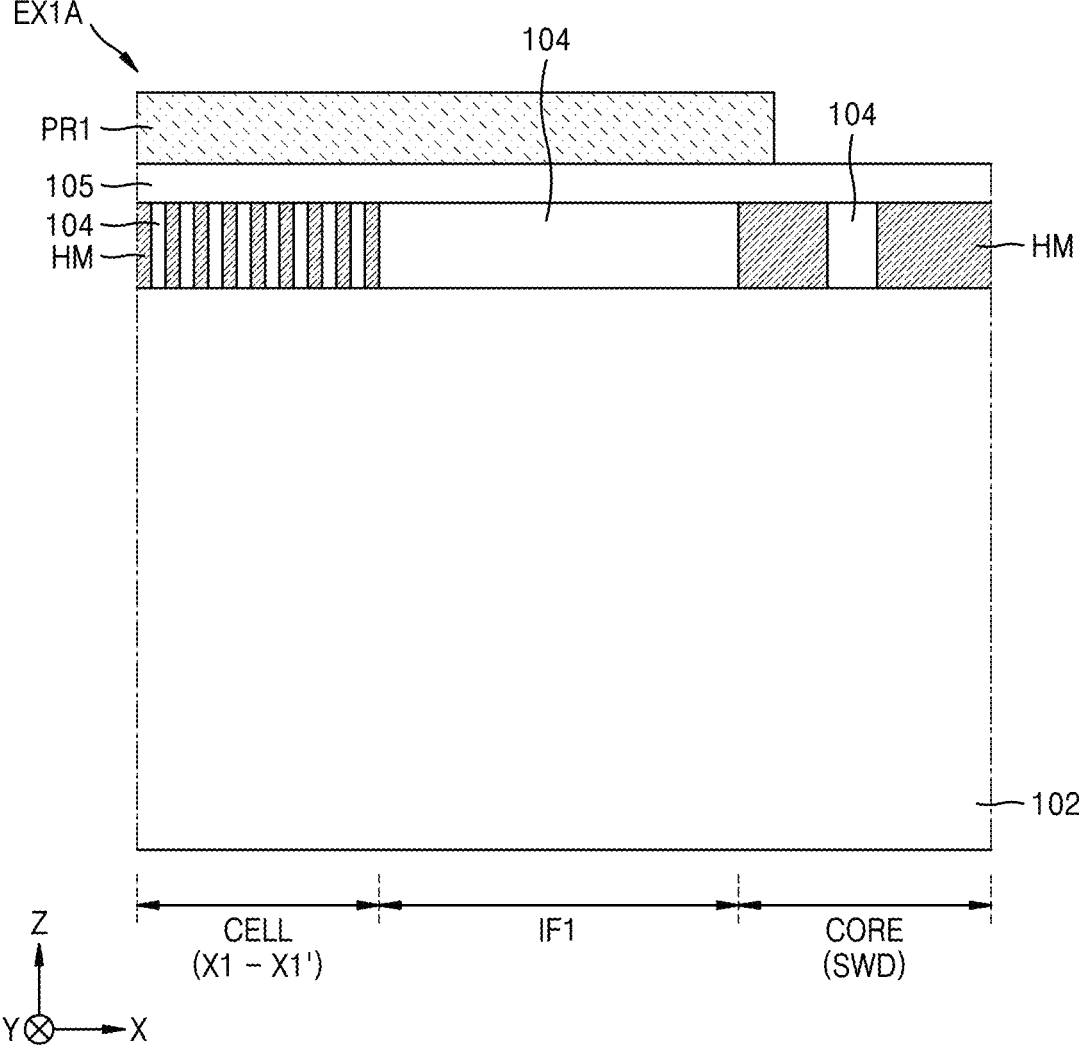

Referring to FIG. 14C, a first photoresist pattern PR1 may be formed on the resulting product of FIG. 14B to cover the cell array area CELL and the interface area IF (see FIG. 4) that includes the first and second interface areas IF1 and IF2. The capping mask layer 105 may be exposed by the first photoresist pattern PR1, in the peripheral circuit area including the core area CORE.

Figure 14D:
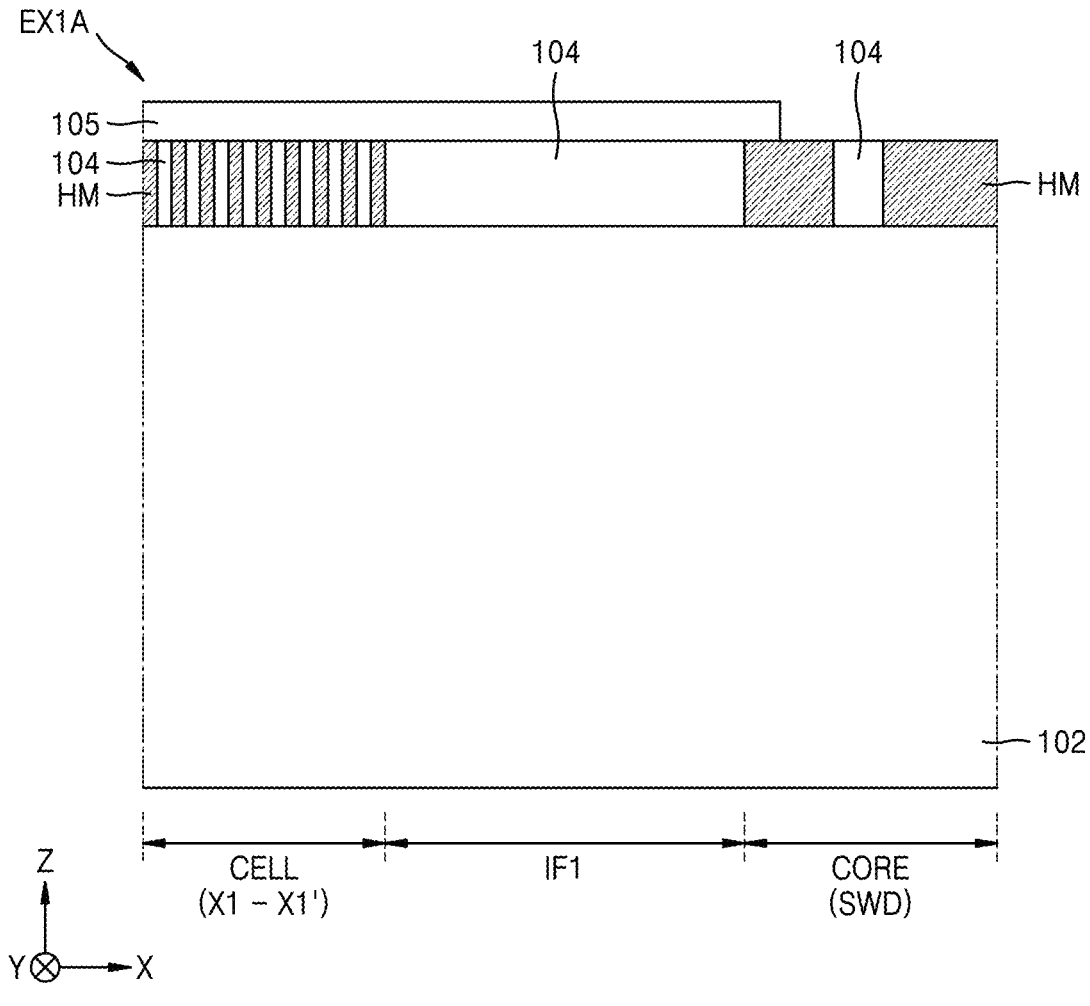

Referring to FIG. 14D, in the resulting product of FIG. 14C, by etching the capping mask layer 105 by using the first photoresist pattern PR1 as an etch mask, the hardmask pattern HM and the protective mask pattern 104 may be exposed in the peripheral circuit area including the core area CORE, and then, the first photoresist pattern PR1 may be removed.

Figure 14E:
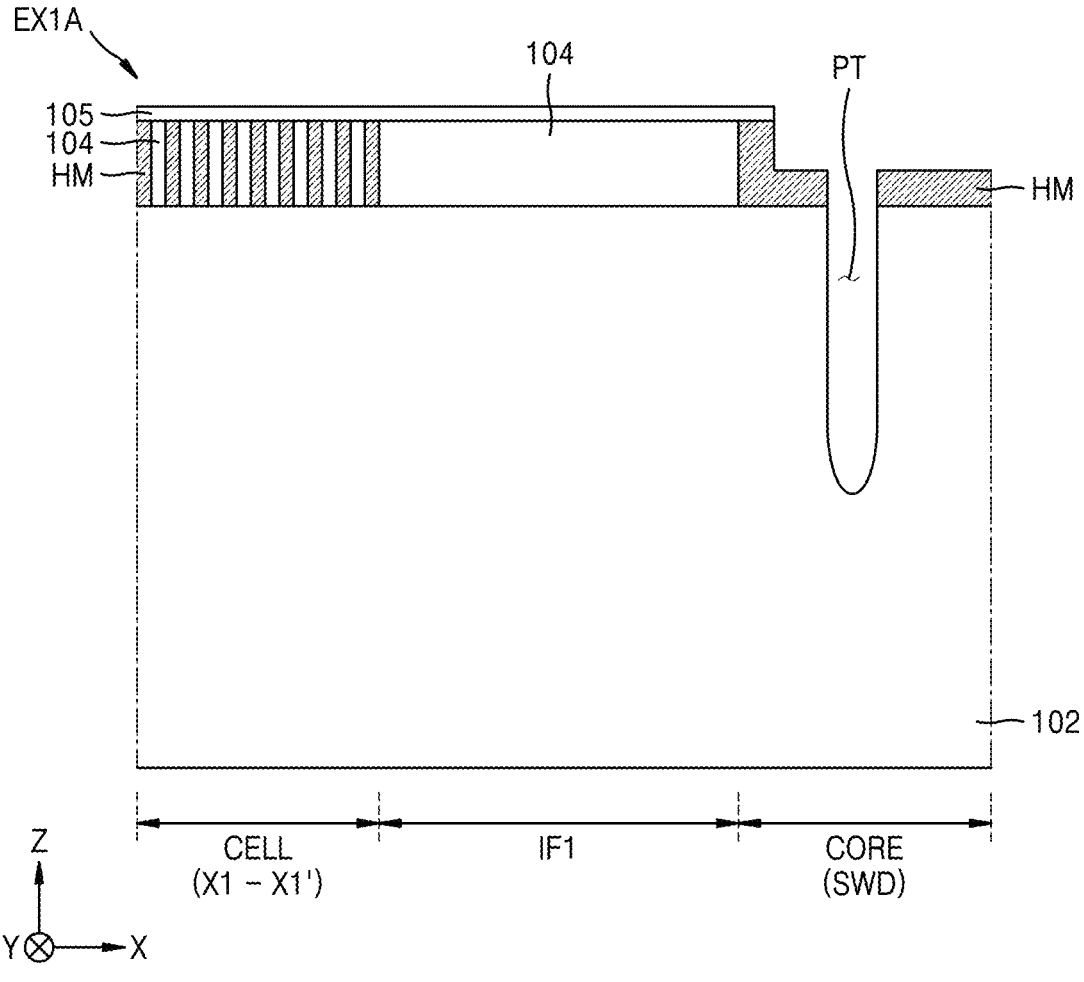

Referring to FIG. 14E, a portion of the substrate 102 may be exposed in the peripheral circuit area including the core area CORE by removing the exposed protective mask pattern 104 from the resulting product of FIG. 14D, followed by etching the exposed portion of the substrate 102 by using the hardmask pattern HM and the capping mask layer 105, which remain on or over the substrate 102, as an etch mask, thereby forming a preliminary trench PT in the substrate 102 in the peripheral circuit area including the core area CORE. The depth of the preliminary trench PT in the vertical direction (the Z direction) may be less than the maximum depth of the peripheral device isolation film 110B that is intended to be formed in the substrate 102 in the peripheral circuit area including the core area CORE. While the substrate 102 is being etched to form the preliminary trench PT, a portion of each of the hardmask pattern HM and the capping mask layer 105 may be consumed by the etching atmosphere.

In some embodiments, a process of etching the substrate 102 to form the preliminary trench PT may use a bosch process. For example, to form a first through-hole in the substrate 102, an inductively coupled plasma deep reactive ion etching (ICP DRIE) process using $SF_6$ or $O_2$ plasma and a sidewall passivation process using one of CFx-based materials, such as $C_4F_8$ and the like, may be repeated a plurality of times.

Figure 14F:
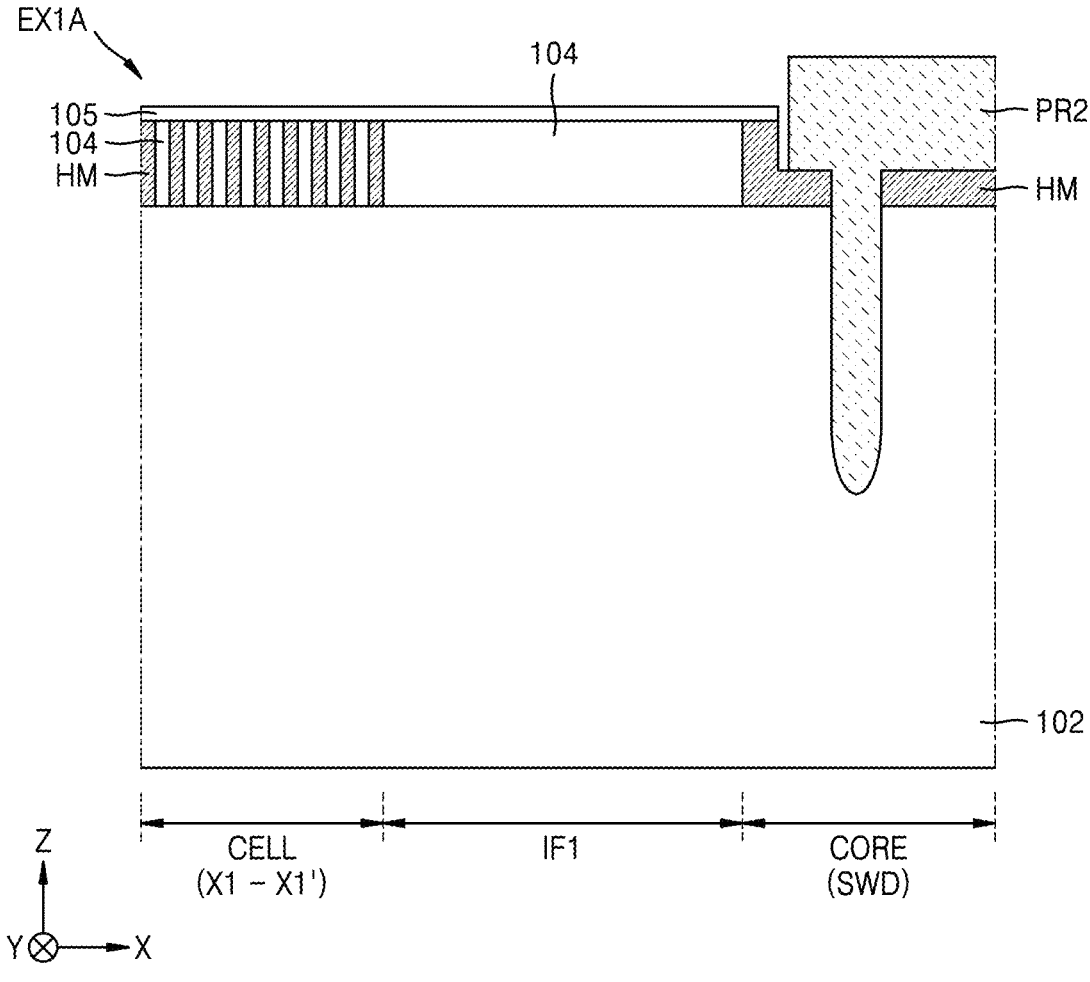

Referring to FIG. 14F, in the resulting product of FIG. 14E, a second photoresist pattern PR2 may be formed to cover the peripheral circuit area including the core area CORE. After the second photoresist pattern PR2 is formed, the hardmask pattern HM and the capping mask layer 105 may be exposed in the cell array area CELL and the interface area IF that includes the first and second interface areas IF1 and IF2.

Figure 14G:
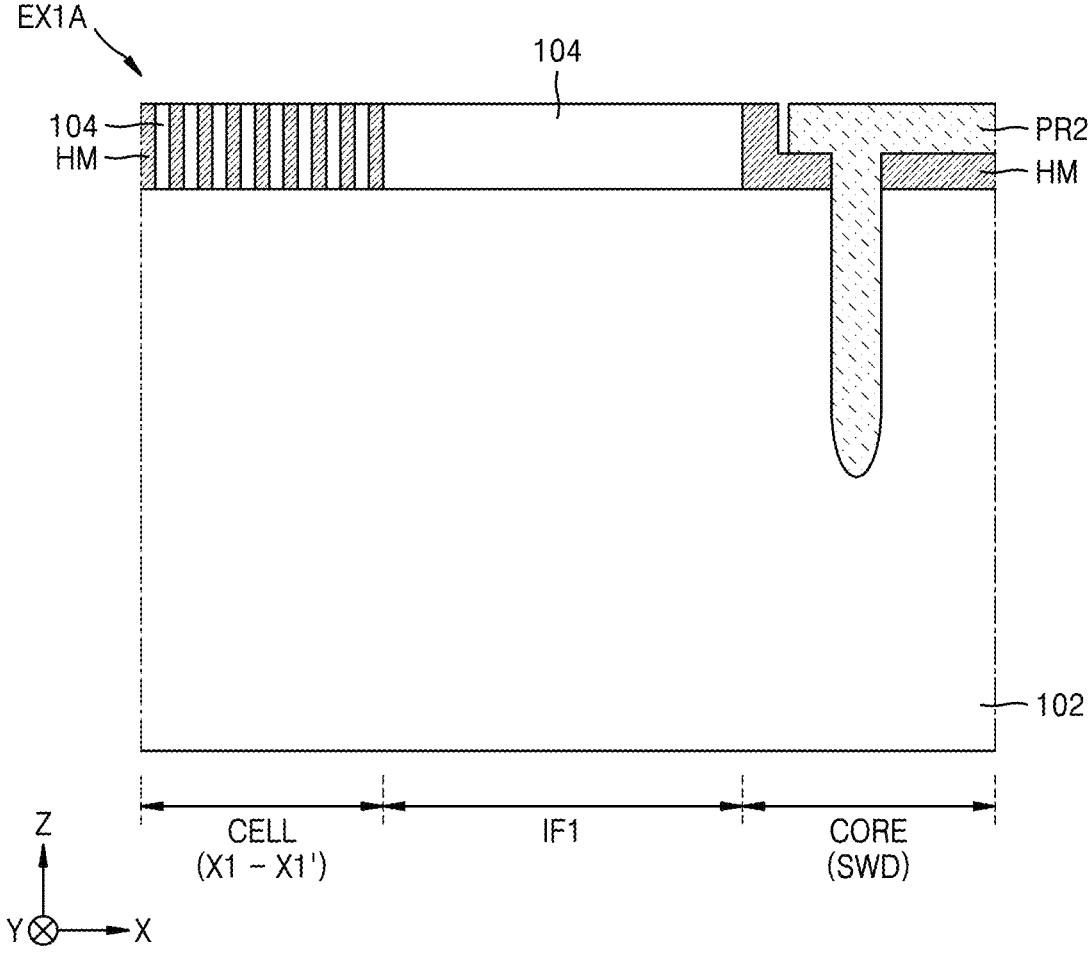

Referring to FIG. 14G, the exposed capping mask layer 105 may be removed from the resulting product of FIG. 14F, thereby exposing the hardmask pattern HM and the protective mask pattern 104, which have been under the capping mask layer 105.

Figure 14H:
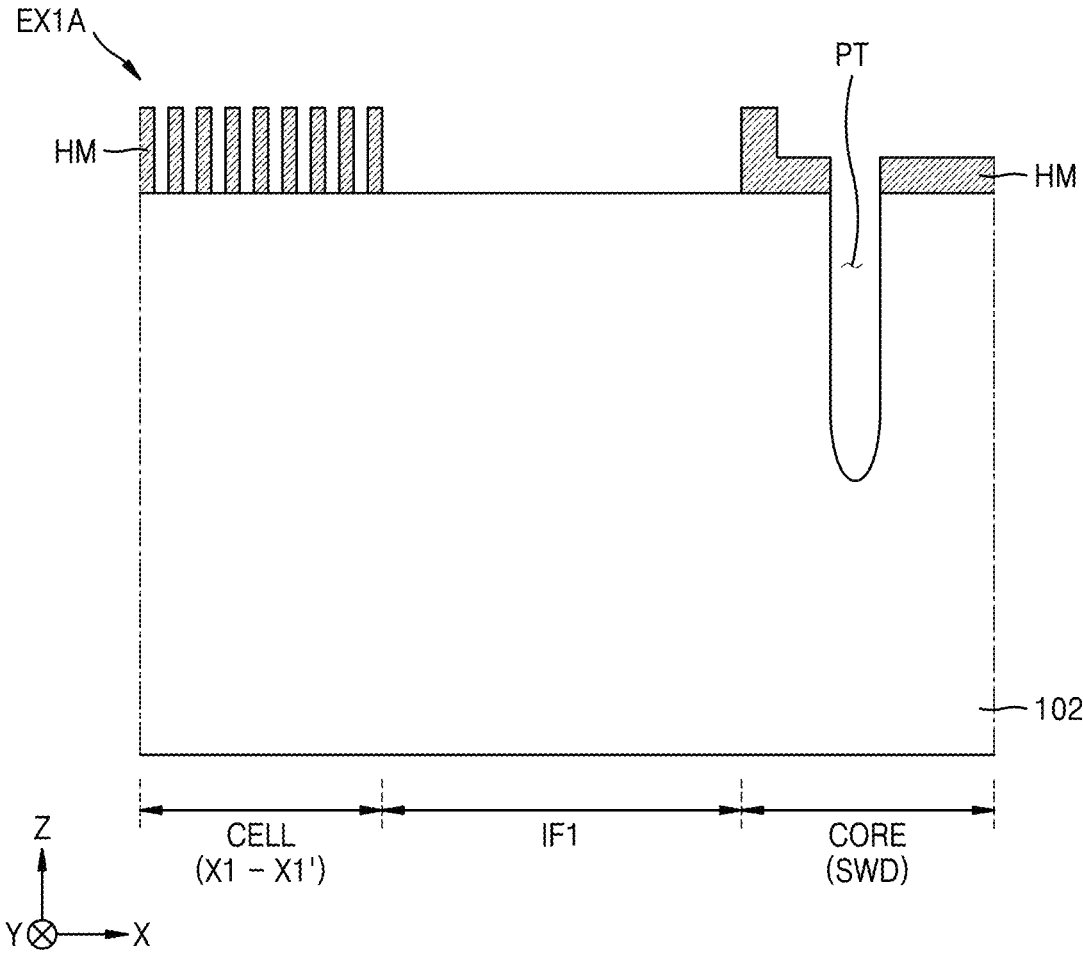

Referring to FIG. 14H, the protective mask pattern 104 and the second photoresist pattern PR2 may be removed from the resulting product of FIG. 14G. As a result, the substrate 102 may be exposed in the preliminary trench PT.

Figure 14I:
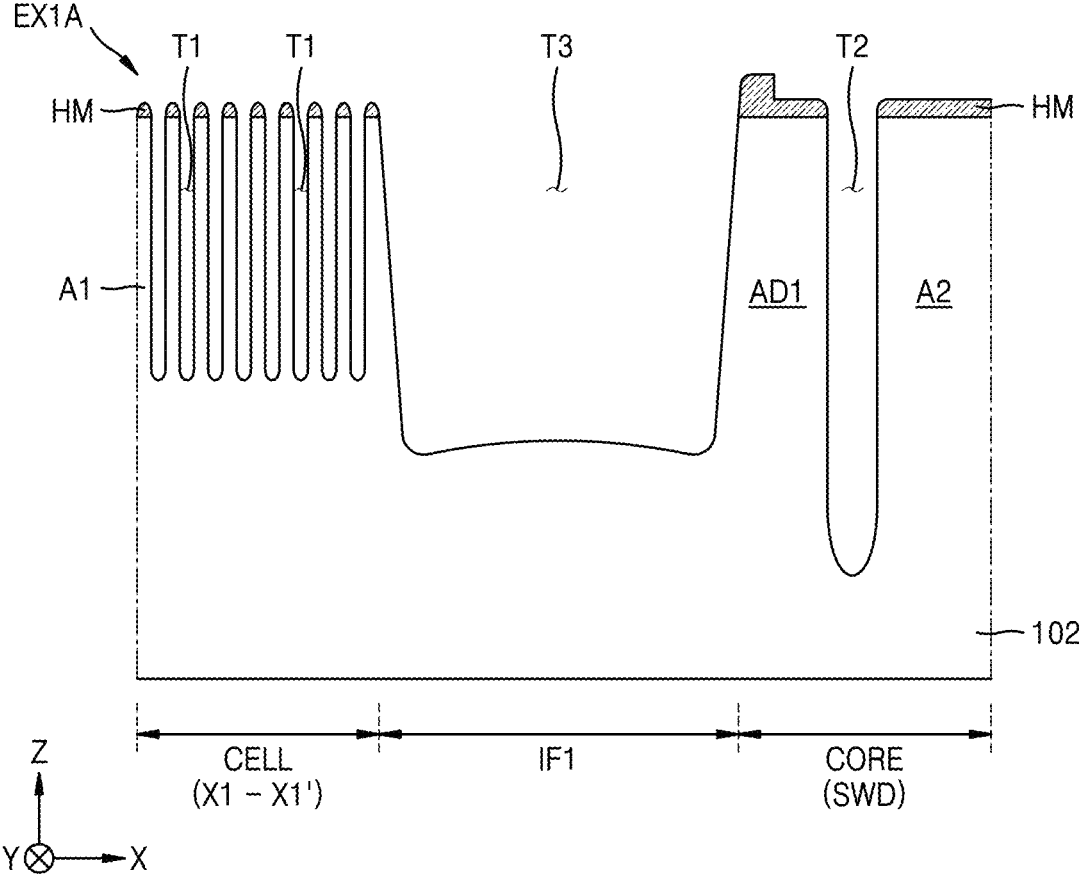

Referring to FIG. 14I, in the resulting product of FIG. 14H, the substrate 102 may be etched by using the hardmask pattern HM, which remains on the substrate 102, as an etch mask, whereby a first trench T1 may be formed in the cell array area CELL, a second trench T2 may be formed in the peripheral circuit area including the core area CORE, and a third trench T3 may be formed in the interface area IF including the first and second interface areas IF1 and IF2. In the vertical direction (the Z direction), the depth of the second trench T2 may be greater than the depth of each of the first trench T1 and the third trench T3, and the depth of the third trench T3 may be greater than the first trench T1. As the first trench T1, the second trench T2, and the third trench T3 are formed, the active dam region AD1 may be formed between the second trench T2 and the third trench T3 in the substrate 102.

While the substrate 102 is being etched to form the first trench T1, the second trench T2, and the third trench T3, a portion of the hardmask pattern HM may be consumed, and a resulting product, in which the other portion of the hardmask pattern HM remains on the substrate 102, may be obtained. A process of etching the substrate 102 to form the first trench T1, the second trench T2, and the third trench T3 may use a bosch process. A more detailed configuration of the bosch process is the same as described with reference to FIG. 14E. As a result, the inner sidewall of the third trench T3 formed in the peripheral circuit area including the core area CORE may include an uneven surface, similar to the sidewall S1 of the active dam region AD1, which is described with reference to FIG. 5C.

Although FIGS. 14A to 14I each illustrate a cross-sectional configuration in a portion of the integrated circuit device 100, which corresponds to the region EX1A of FIG. 4, according to the sequence of processes, the processes described with reference to FIGS. 14A to 14I may also be equally performed in a portion of the integrated circuit device 100, which corresponds to the region EX1B of FIG. 4. Therefore, after the process of FIG. 14I is performed, a resulting product, in which a portion of the hardmask pattern HM remains on the substrate 102, may also be obtained in the portion of the integrated circuit device 100, which corresponds to the region EX1B of FIG. 4, similar to the description made with reference to FIG. 14I.

Figure 15A:
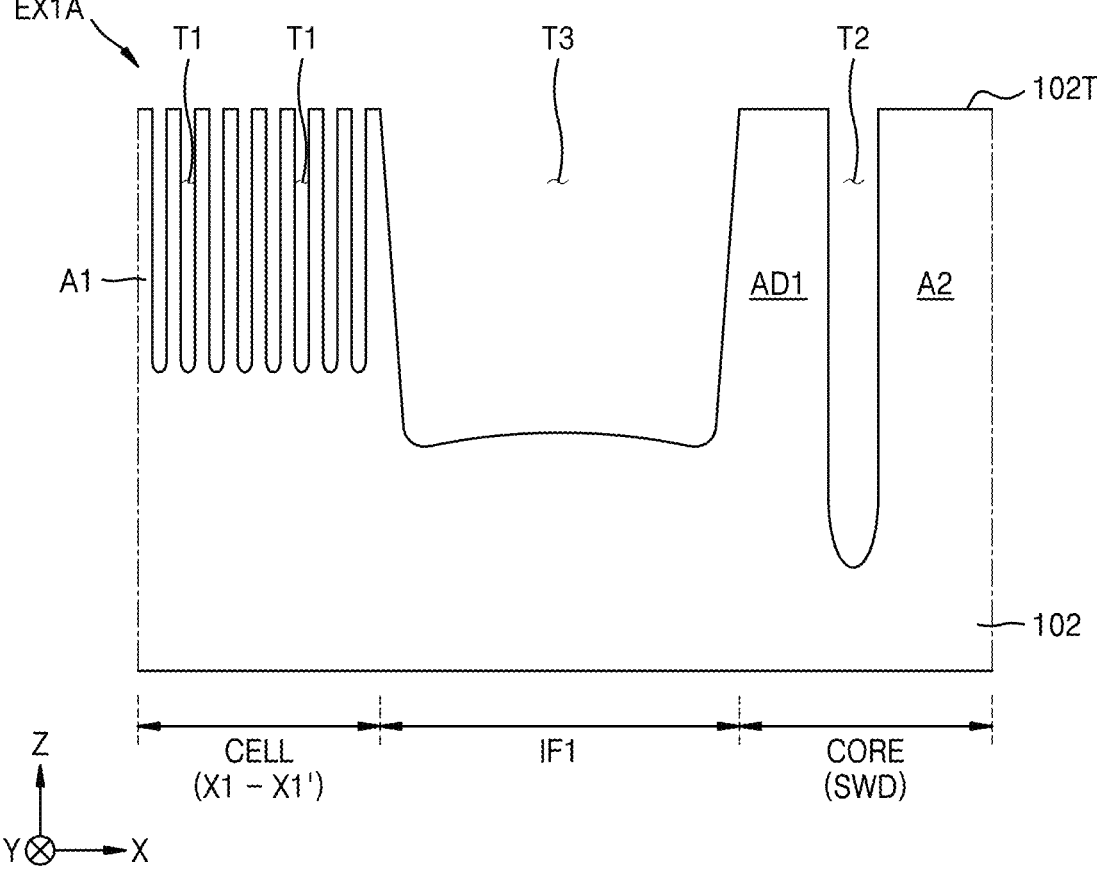
Figure 15B:
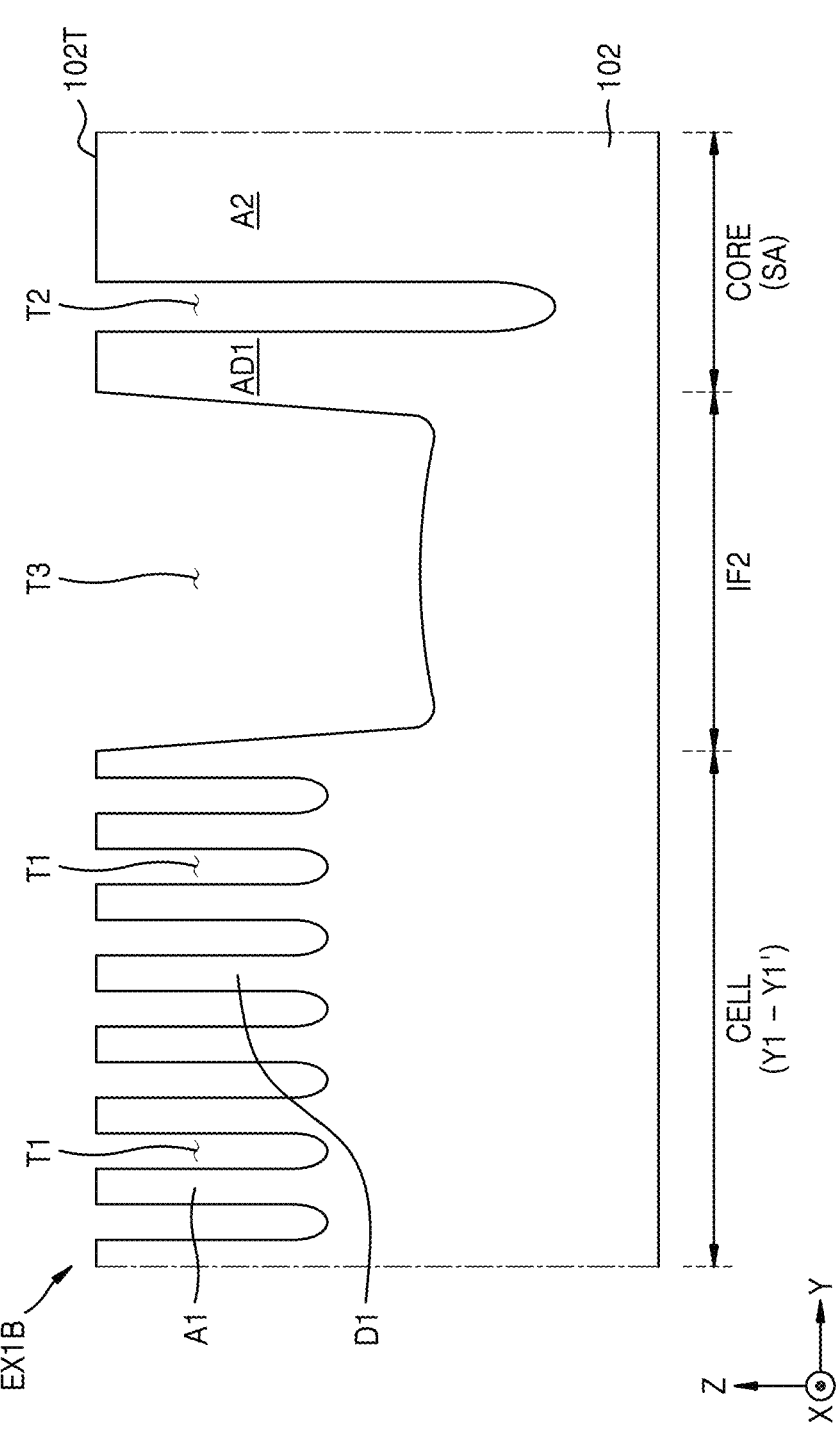

Referring to FIGS. 15A and 15B, the hardmask pattern HM remaining on the resulting product of FIG. 14I may be removed, and a resulting product may be cleaned.

A plurality of cell active regions A1 and a plurality of dummy cell active regions D1 may be defined in the substrate 102 in the cell array area CELL by the first trench T1, an active dam region AD1 may be defined in the substrate 102 between the second trench T2 and the third trench T3, and a plurality of peripheral active regions A2 may be defined, by the third trench T3, in the peripheral circuit area including the core area CORE.

Figure 16A:
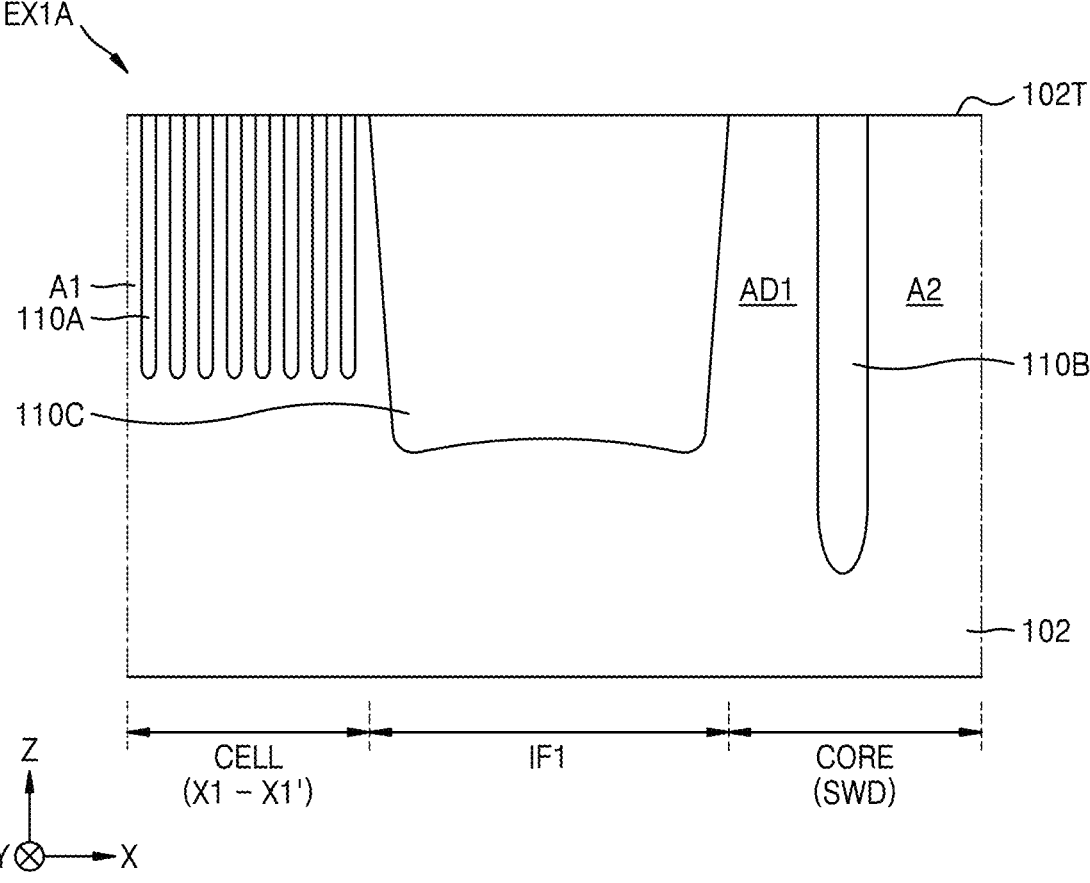
Figure 16B:
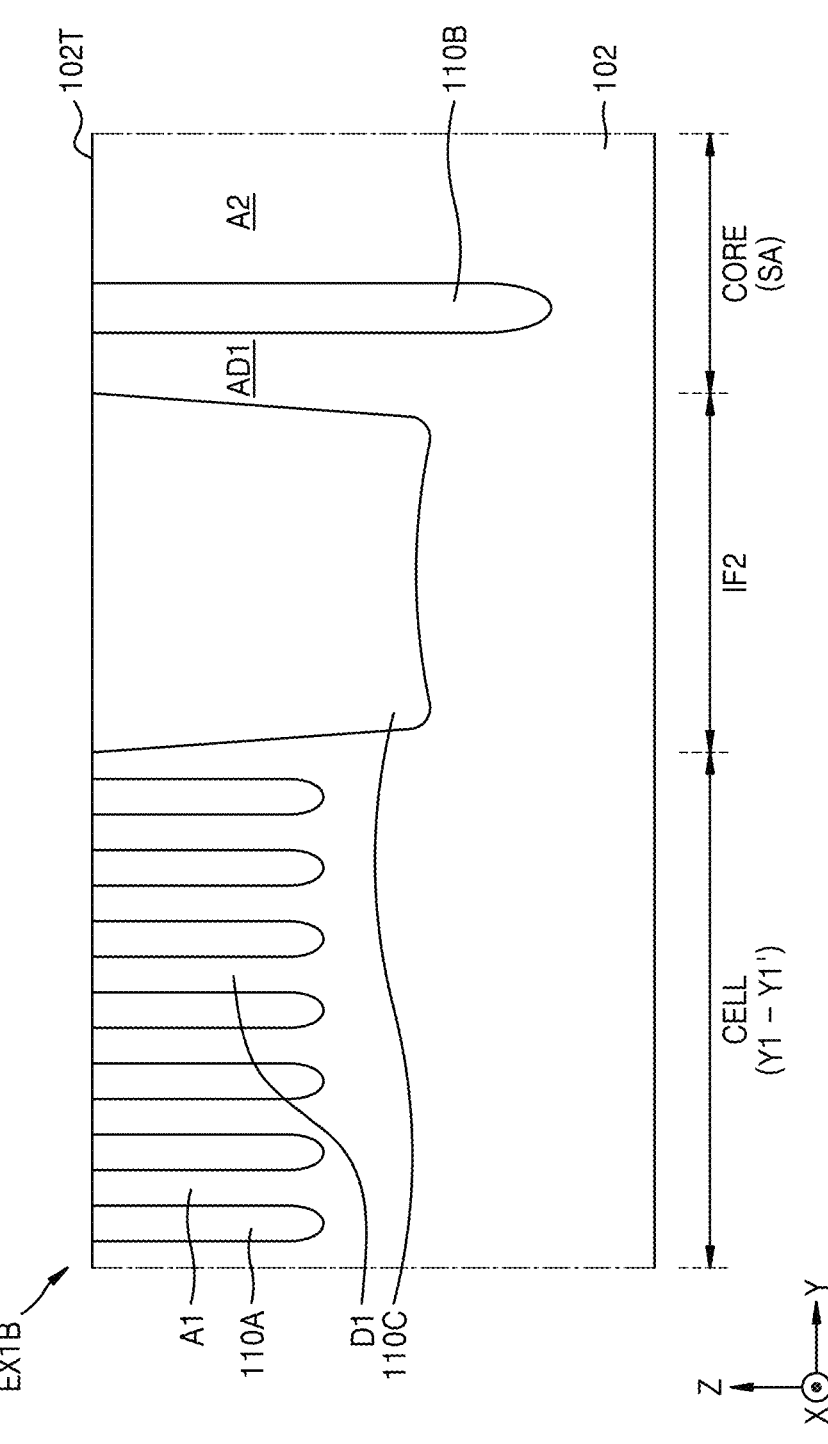

Referring to FIGS. 16A and 16B, in the resulting product of FIGS. 15A and 15B, a cell device isolation film 110A, which fills the first trench T1, a peripheral device isolation film 110B, which fills the second trench T2, and an interface device isolation film 110C, which fills the third trench T3, may be formed.

After the cell device isolation film 110A, the peripheral device isolation film 110B, and the interface device isolation film 110C are formed, an upper surface 102T of the substrate 102 may be exposed. The upper surface 102T of the substrate 102 may correspond to the upper surface 102M of the substrate 102 shown in FIGS. 5A and 5B.

Figure 17A:
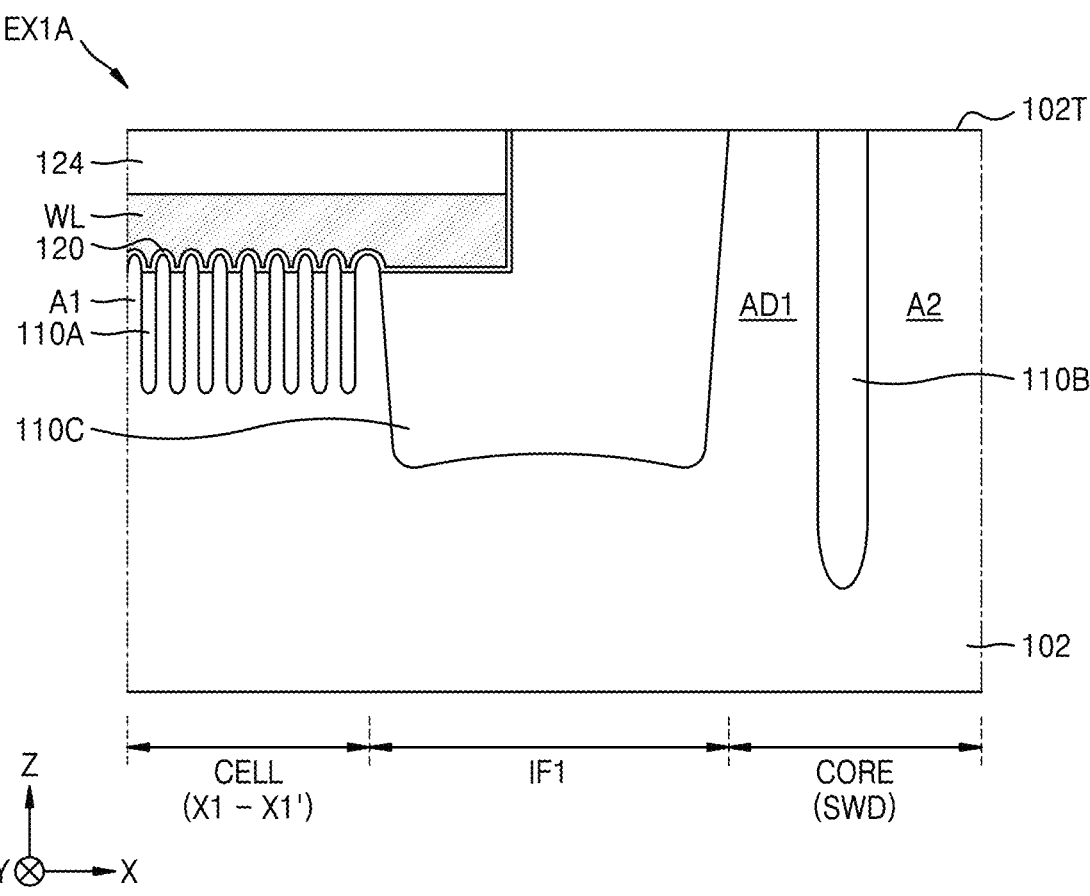
Figure 17B:
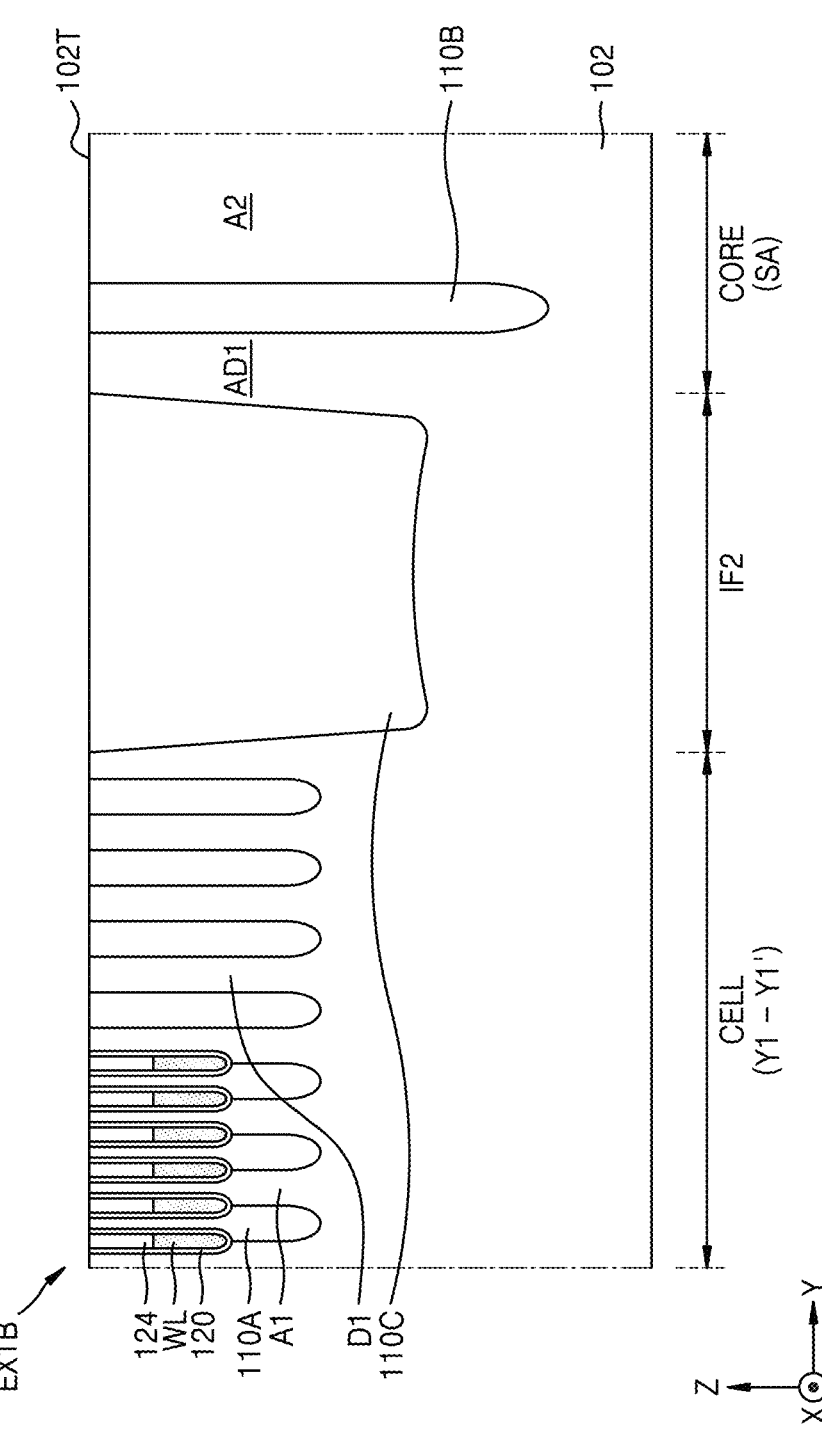

Referring to FIGS. 17A and 17B, in the resulting product of FIGS. 16A and 16B, a portion of each of the substrate 102 and the cell device isolation film 110A in the cell array area CELL may be etched, thereby forming a plurality of word line trenches. At the lower surface of each of the plurality of word line trenches, the surface of each of the plurality of cell active regions A1 may be located higher than the surface of the cell device isolation film 110A. Therefore, the lower surface of each of the plurality of word line trenches may have a step. Next, a gate dielectric film 120, a word line WL, and a buried insulating film 124 may be formed in the stated order in each of the plurality of word line trenches.

Figure 18A:
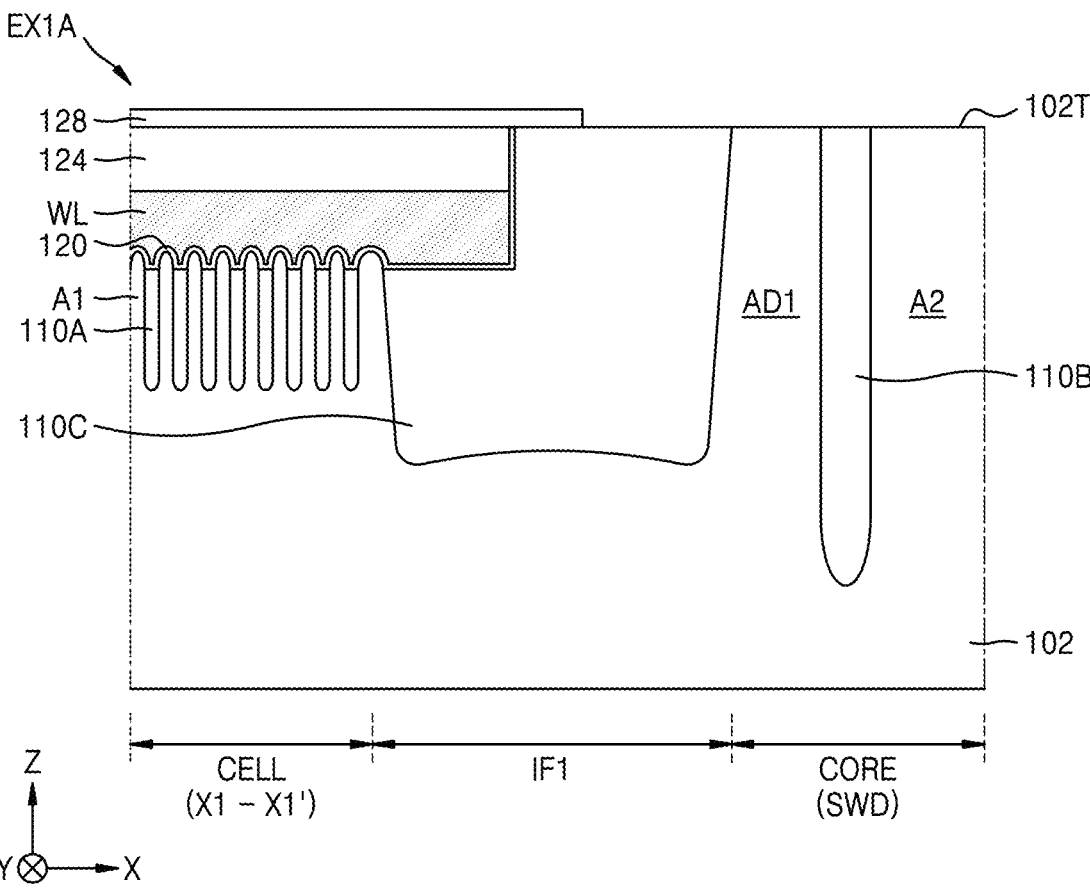
Figure 18B:
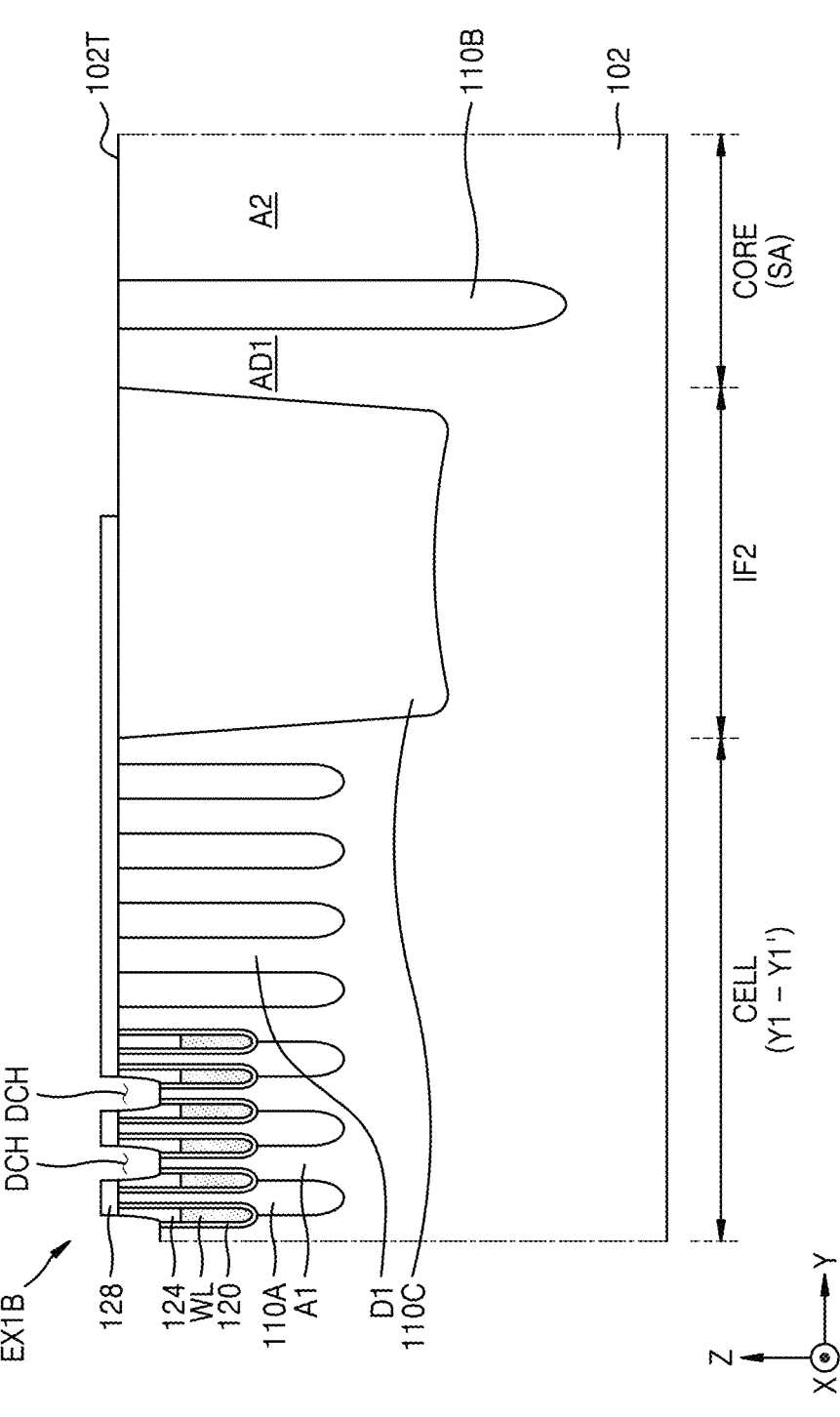

Referring to FIGS. 18A and 18B, a buffer film 128 may be formed on the resulting product of FIGS. 17A and 17B. The buffer film 128 may be formed to cover the substrate 102 in the cell array area CELL and in respective portions of the first and second interface areas IF1 and IF2. Next, as shown in FIG. 18B, a plurality of direct contact holes DCH may be formed through the buffer film 128 in the cell array area CELL to each expose the cell active region A1.

Figure 19A:
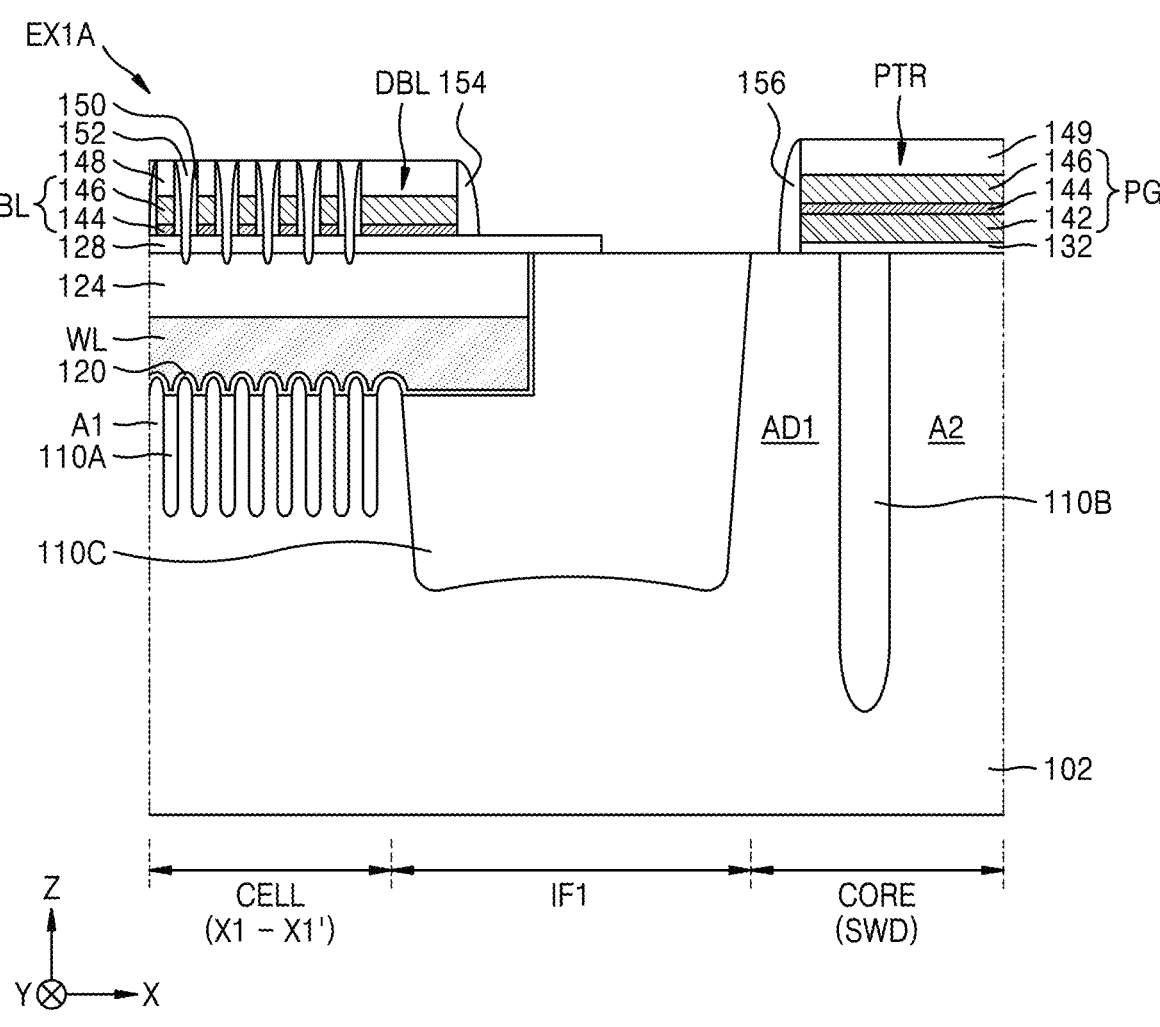
Figure 19B:
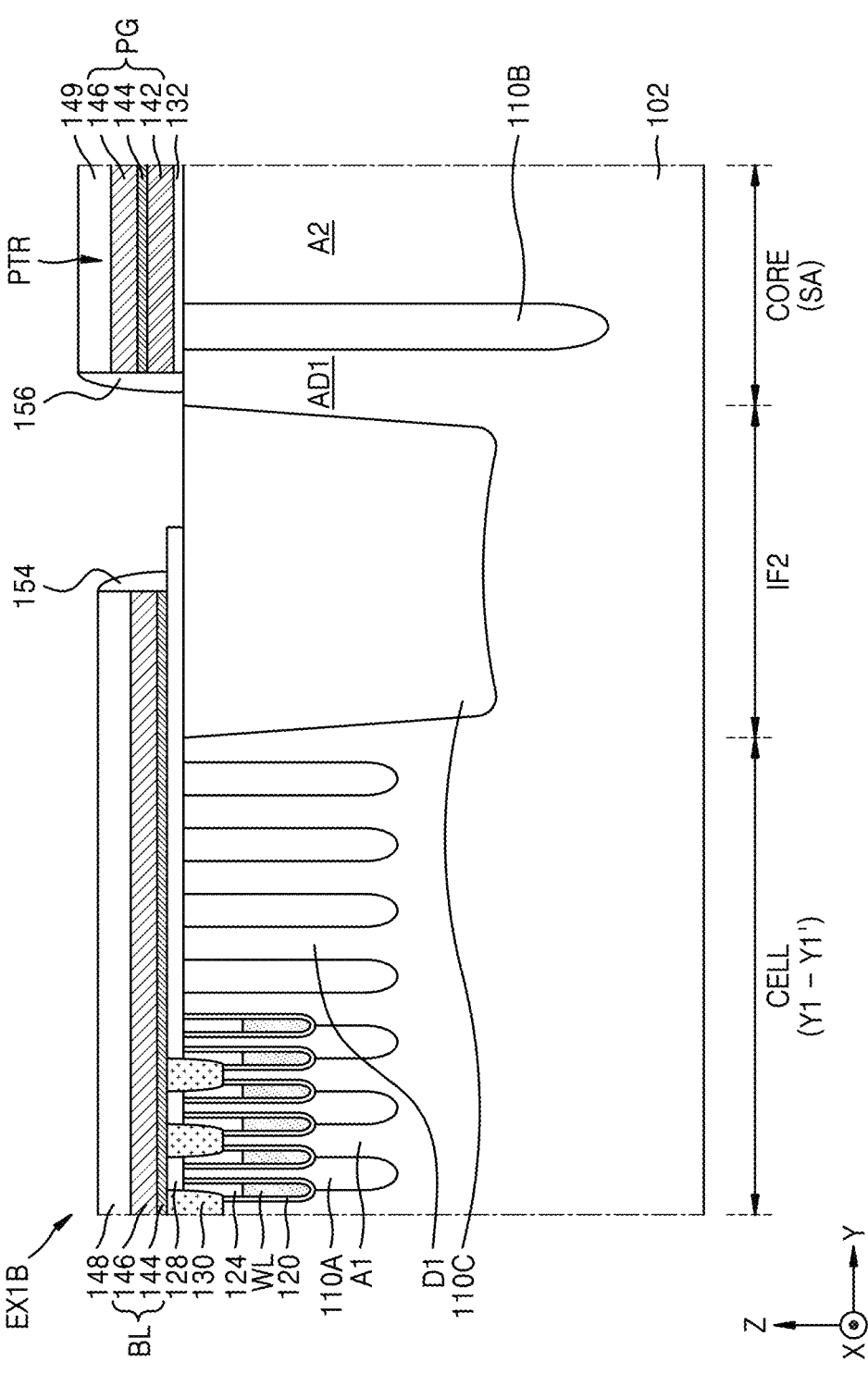

Referring to FIGS. 19A and 19B, a plurality of direct contacts 130 may be formed on the resulting product of FIGS. 18A and 18B to respectively fill the plurality of direct contact holes DCH, a plurality of bit lines BL and a dummy bit line DBL on the direct contact 130 and the buffer film 128 in the cell array area CELL, insulating capping patterns 148 and 149, which cover the upper surface of each of the dummy bit line DBL and the plurality of bit lines BL, insulating spacers 150 and 154, which cover the sidewall of each of the dummy bit line DBL and the plurality of bit lines BL, and a plurality of insulating fences 152 and a plurality of contact plugs, which fill each space between the plurality of bit lines BL, may be formed. In addition, while the plurality of bit lines BL, the dummy bit line DBL, and structures around the plurality of bit lines BL and the dummy bit line DBL are being formed in the cell array area CELL, a plurality of peripheral transistors PTR may be formed in the peripheral circuit area including the core area CORE. To form the plurality of peripheral transistors PTR, a gate dielectric film 132, a peripheral gate PG, and an insulating capping pattern 149 may be formed in the stated order on the substrate 102, followed by forming an insulating spacer 156 to cover the sidewall of each thereof, and then, a plurality of source/drain regions may be formed by performing ion implantation on the substrate 102 on both sides of the peripheral gate PG.

Figure 20A:
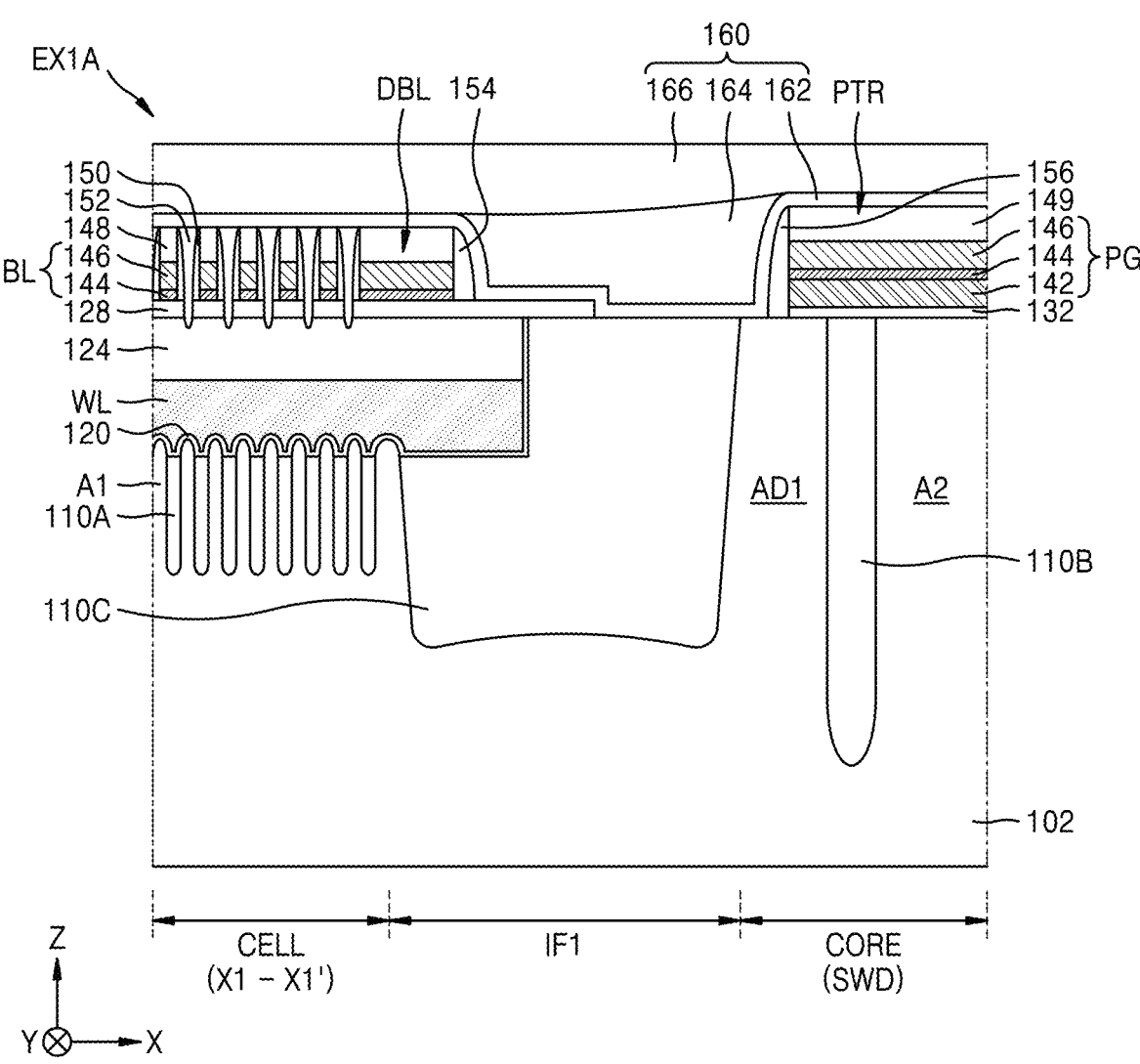
Figure 20B:
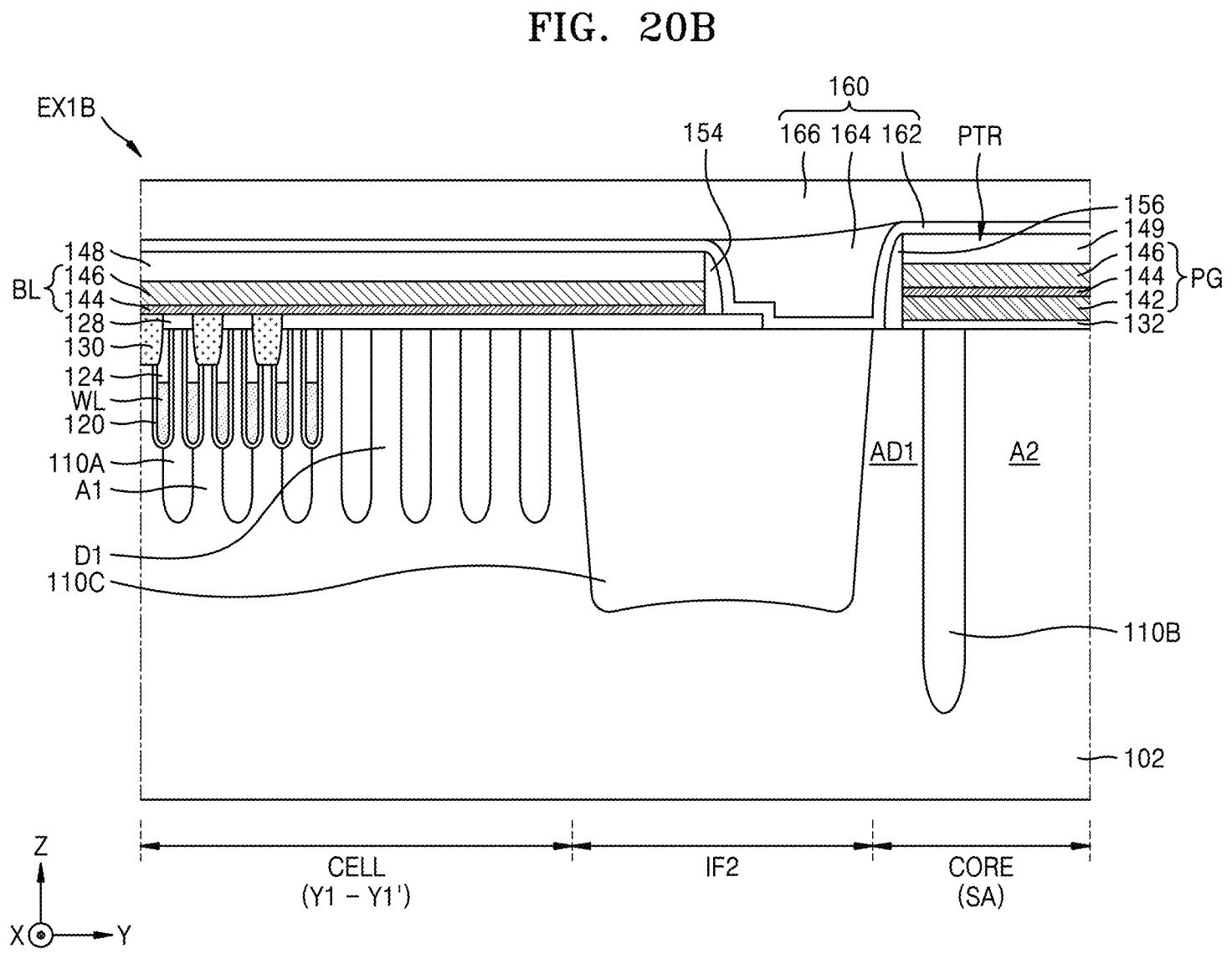

Referring to FIGS. 20A and 20B, an insulating structure 160 may be formed to cover the resulting product of FIGS. 19A and 19B. To form the insulating structure 160, an insulating liner 162 may be formed first to conformally cover the resulting product of FIGS. 19A and 19B, followed by filling a recess space over the insulating liner 162 with a gap-fill insulating film 164, and then, an insulating film 166 may be formed on the insulating liner 162 and the gap-fill insulating film 164.

Figure 21A:
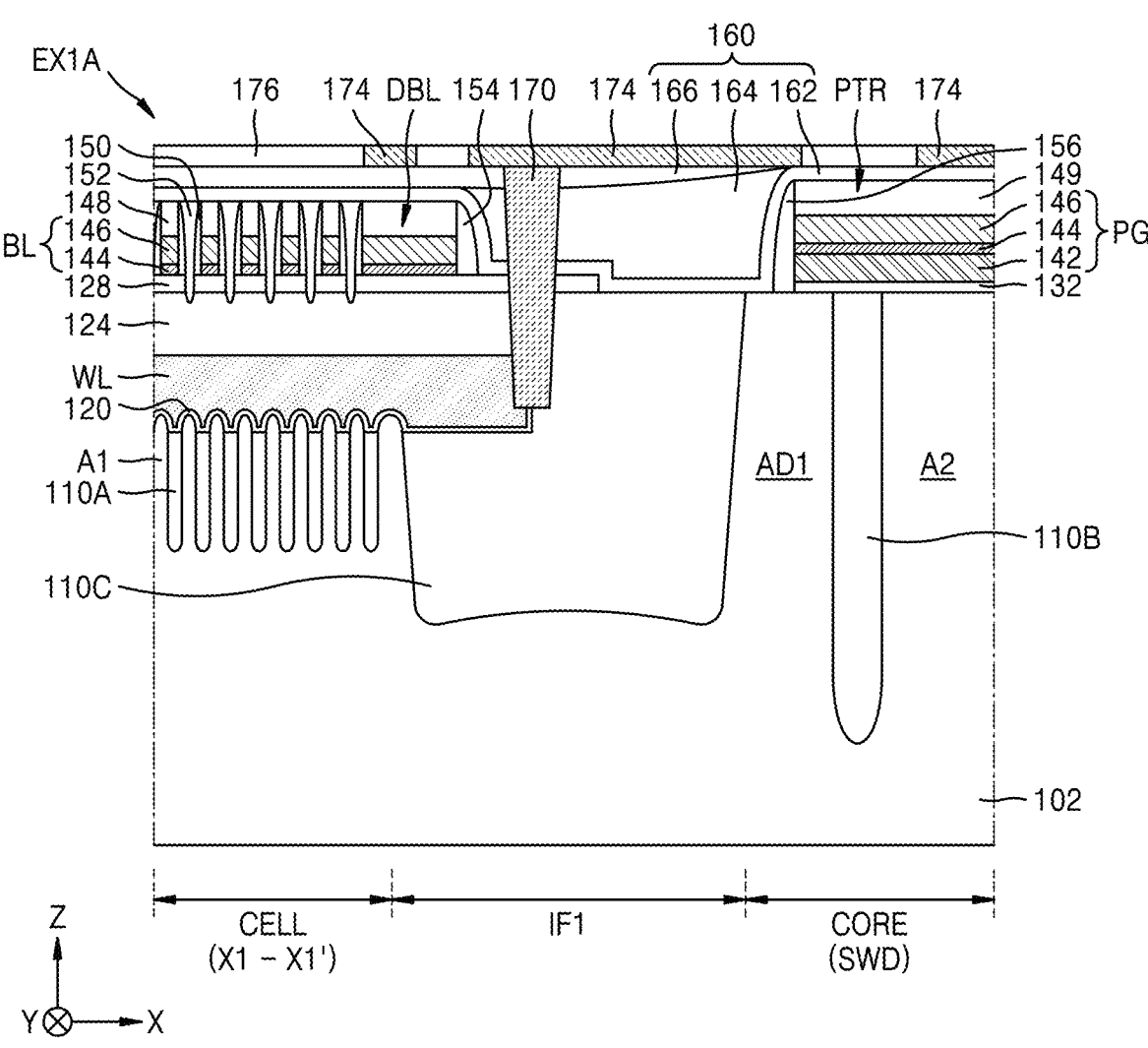
Figure 21B:
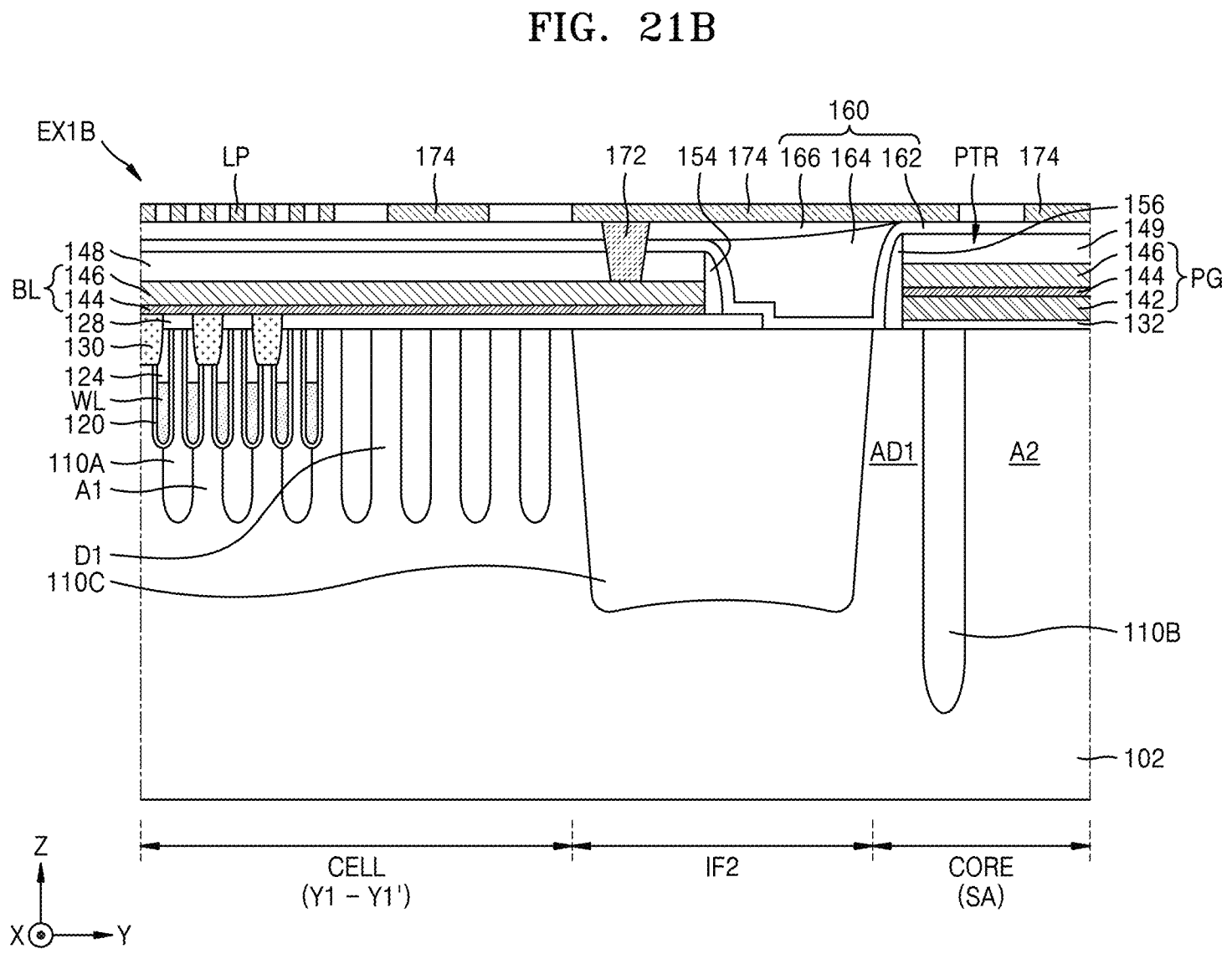

Referring to FIGS. 21A and 21B, in the resulting product of FIGS. 20A and 20B, a process of planarizing the insulating structure 160 may be performed. As a result, the height of the insulating film 166 may be reduced and the insulating liner 162 may be exposed in the peripheral circuit area including the core area CORE, but the inventive concept is not limited thereto.

Next, a word line contact 170, which passes through the insulating structure 160 in the vertical direction and contacts a word line WL, and a bit line contact 172, which passes through the insulating structure 160 in the vertical direction and contacts a bit line BL, may be formed, and a plurality of wiring structures may be formed on the insulating structure 160. The plurality of wiring structures may include a plurality of conductive landing pads LP, which are arranged over the plurality of bit lines BL in the cell array area CELL, and a plurality of wiring patterns 174 arranged in the first and second interface areas IF1 and IF2 and the core area CORE. One wiring pattern 174 selected from the plurality of wiring patterns 174 may be formed to contact the word line contact 170, and another wiring pattern 174 selected from the plurality of wiring patterns 174 may be formed to contact the bit line contact 172.

According to the method, which is described with reference to FIGS. 14A to 21B, of manufacturing the integrated circuit device 100 shown in FIGS. 5A to 5C, the cell device isolation film 110A in the cell array area CELL and the peripheral device isolation film 110B in the peripheral circuit area including the core area CORE may be formed with different depths by separate processes, respectively. Therefore, in the peripheral circuit area including the core area CORE, the peripheral device isolation film 110B may be formed with a depth that is greater than that in the cell array area CELL. Therefore, even when the area of the peripheral active region A2 arranged in the peripheral circuit area is reduced, unit devices, for example, the plurality of peripheral transistors PTR, arranged in the peripheral circuit area may be prevented from suffering from issues due to breakdown voltage, leakage current, or the like, and the yield and reliability of the unit devices arranged in the peripheral circuit area may improve.

Heretofore, while the example of the method of manufacturing the integrated circuit device 100 shown in FIGS.

5A to 5C has been described with reference to FIGS. 14A to 21B, it will be understood by those of ordinary skill in the art that, by making various modifications and changes to the example described with reference to FIGS. 14A to 21B without departing from the spirit and scope of the inventive concept, the integrated circuit devices 100A, 100B, 100C, 100D, 200, 300, 300A, and 300B described with reference to FIGS. 6 to 13 may be manufactured.

While the inventive concept has been particularly shown and described with reference to embodiments thereof, it will be understood that various changes in form and details may be made therein without departing from the spirit and scope of the disclosure.

What is claimed is:

1. An integrated circuit device comprising:
a substrate having a cell array area, a peripheral circuit area, and an interface area, the peripheral circuit area comprising a core area that is adjacent to the cell array area, and the interface area being between the cell array area and the core area;
a cell device isolation film arranged in the substrate to define a plurality of cell active regions in the cell array area of the substrate, the cell device isolation film having a first depth in a vertical direction from an upper surface of the substrate;
a plurality of peripheral device isolation films arranged in the substrate to define a plurality of peripheral active regions in the peripheral circuit area of the substrate, each of the plurality of peripheral device isolation films having a second depth in the vertical direction from the upper surface of the substrate, the second depth being greater than the first depth;
an interface device isolation film in the interface area of the substrate; and
an active dam surrounding the cell array area in a plan view,
wherein at least a first portion of the active dam is in the core area, and
at least a second portion of the active dam is apart from the cell array area with the interface device isolation film therebetween.

2. The integrated circuit device of claim 1, wherein, in the plan view, the active dam has a closed-loop shape continuously surrounding the cell array area without interruption.

3. The integrated circuit device of claim 1, wherein the core area comprises a sub-word line driver area, which is adjacent to the cell array area in a first horizontal direction, and a sense amplifier area, which is adjacent to the cell array area in a second horizontal direction intersecting with the first horizontal direction, and
the active dam comprises:
a first local region between the interface device isolation film and a first peripheral device isolation film in the sub-word line driver area, the first peripheral device isolation film being closest to the interface device isolation film, among the plurality of peripheral device isolation films; and
a second local region between the interface device isolation film and a second peripheral device isolation film in the sense amplifier area, the second peripheral device isolation film being closest to the interface device isolation film, among the plurality of peripheral device isolation films.

4. The integrated circuit device of claim 1, wherein the core area comprises a sub-word line driver area, which is adjacent to the cell array area in a first horizontal direction, and a sense amplifier area, which is adjacent to the cell array area in a second horizontal direction intersecting with the first horizontal direction, and
the active dam comprises:
a first local region between the interface device isolation film and a first peripheral device isolation film in the sub-word line driver area, the first peripheral device isolation film being closest to the interface device isolation film, among the plurality of peripheral device isolation films; and
a second local region in the cell array area facing the sense amplifier area in a horizontal direction, the second local region being between the interface device isolation film and a portion of the cell device isolation film that is closest to the interface device isolation film.

5. The integrated circuit device of claim 1, further comprising:
a bit line over the substrate in the cell array area;
a wiring pattern apart from the substrate in the vertical direction with the bit line therebetween; and
a bit line contact extending in the vertical direction between the bit line and the wiring pattern and configured to be electrically connected to each of the bit line and the wiring pattern,
wherein the core area comprises a sub-word line driver area, which is adjacent to the cell array area in a first horizontal direction, and a sense amplifier area, which is adjacent to the cell array area in a second horizontal direction intersecting with the first horizontal direction,
the active dam comprises a local region in the cell array area facing the sense amplifier area in the second horizontal direction, the local region being between the interface device isolation film and a portion of the cell device isolation film that is closest to the interface device isolation film, and
the local region of the active dam and the bit line contact overlap each other in the vertical direction.

6. The integrated circuit device of claim 1, further comprising:
a bit line over the substrate in the cell array area;
a wiring pattern apart from the substrate in the vertical direction with the bit line therebetween; and
a bit line contact extending in the vertical direction between the bit line and the wiring pattern and configured to be electrically connected to each of the bit line and the wiring pattern,
wherein the core area comprises a sub-word line driver area, which is adjacent to the cell array area in a first horizontal direction, and a sense amplifier area, which is adjacent to the cell array area in a second horizontal direction intersecting with the first horizontal direction,
the active dam comprises a local region in the cell array area facing the sense amplifier area in the second horizontal direction, the local region being between the interface device isolation film and a portion of the cell device isolation film that is closest to the interface device isolation film, and
a distance in the second horizontal direction from the local region of the active dam to the cell array area is smaller than a distance in the second horizontal direction from the bit line contact to the cell array area.

7. The integrated circuit device of claim 1, wherein
a sidewall of each of at least some peripheral device isolation films comprises an upper sidewall and a lower sidewall, wherein a distance from the upper surface of the substrate to the lower sidewall is greater than a distance from the upper surface of the substrate to the upper sidewall, and wherein an inclination of the upper sidewall is different from an inclination of the lower sidewall.

8. The integrated circuit device of claim 1, further comprising:

a word line at a vertical level, which is lower than a vertical level of the upper surface of the substrate, the word line being in the cell array area and extending lengthwise in a first horizontal direction across the plurality of cell active regions;

a wiring pattern over the substrate; and a word line contact extending in the vertical direction between the word line and the wiring pattern, the word line contact being configured to be electrically connected to each of the word line and the wiring pattern, wherein, in the first horizontal direction, the active dam is between the word line contact and a peripheral active region closest to the word line contact, among the plurality of peripheral active regions.

9. The integrated circuit device of claim 1, further comprising:

a bit line extending lengthwise in a second horizontal direction over the substrate in the cell array area;

a wiring pattern apart from the substrate in the vertical direction with the bit line therebetween; and a bit line contact extending in the vertical direction between the bit line and the wiring pattern, the bit line contact being configured to be electrically connected to each of the bit line and the wiring pattern, wherein, in the second horizontal direction, the active dam is between the bit line contact and a peripheral active region closest to the bit line contact, among the plurality of peripheral active regions.

10. The integrated circuit device of claim 1, further comprising:

a plurality of word lines at a vertical level, which is lower than a vertical level of the upper surface of the substrate, the plurality of word lines being in the cell array area and extending parallel to each other in a first horizontal direction across the plurality of cell active regions;

a bit line over the plurality of word lines in the cell array area and extending lengthwise in a second horizontal direction that intersects with the first horizontal direction;

a wiring pattern apart from the substrate in the vertical direction with the bit line therebetween; and a bit line contact extending in the vertical direction between the bit line and the wiring pattern, the bit line contact being configured to be electrically connected to each of the bit line and the wiring pattern, wherein, in the second horizontal direction, the active dam is between the bit line contact and the plurality of cell active regions.

11. An integrated circuit device comprising:

a substrate having a cell array area, a peripheral circuit area, and an interface area, the peripheral circuit area comprising a core area having a sub-word line driver area and a sense amplifier area, the interface area being between the cell array area and the sub-word line driver area and between the cell array area and the sense amplifier area, the sub-word line driver area being adjacent to the cell array area in a first horizontal direction, and the sense amplifier area being adjacent to the cell array area in a second horizontal direction that intersects with the first horizontal direction;

a cell device isolation film arranged in the substrate to define a plurality of cell active regions in the cell array area of the substrate, the cell device isolation film having a first depth in a vertical direction from an upper surface of the substrate;

a plurality of peripheral device isolation films arranged in the substrate to define a plurality of peripheral active regions in the sub-word line driver area and the sense amplifier area of the substrate, each of the plurality of peripheral device isolation films having a second depth in the vertical direction from the upper surface of the substrate, the second depth being greater than the first depth;

an interface device isolation film in the interface area of the substrate; and an active dam surrounding the cell array area in a plan view, wherein the active dam comprises a first local region in the sub-word line driver area of the core area and a second local region in the sense amplifier area of the core area or in a portion of the cell array area, the portion of the cell array area being adjacent to the sense amplifier area.

12. The integrated circuit device of claim 11, wherein the first local region of the active dam is in contact with a sidewall of the interface device isolation film facing the sub-word line driver area.

13. The integrated circuit device of claim 11, wherein the second local region of the active dam is in contact with a sidewall of the interface device isolation film facing the sense amplifier area.

14. The integrated circuit device of claim 11, wherein, in the plan view, the active dam has a closed-loop shape continuously surrounding the cell array area without interruption.

15. The integrated circuit device of claim 11, further comprising:

a bit line over the substrate in the cell array area;

a wiring pattern apart from the substrate in the vertical direction with the bit line therebetween; and a bit line contact extending in the vertical direction between the bit line and the wiring pattern and configured to be electrically connected to each of the bit line and the wiring pattern, wherein the second local region of the active dam is in a portion of the cell array area adjacent to the sense amplifier area, and the second local region of the active dam and the bit line contact overlap each other in the vertical direction.

16. The integrated circuit device of claim 11, further comprising:

a bit line over the substrate in the cell array area;

a wiring pattern apart from the substrate in the vertical direction with the bit line therebetween; and a bit line contact extending in the vertical direction between the bit line and the wiring pattern and configured to be electrically connected to each of the bit line and the wiring pattern, wherein the second local region of the active dam is in a portion of the cell array area adjacent to the sense amplifier area, and a distance in the second horizontal direction from the second local region of the active dam to the cell array area is smaller than a distance in the second horizontal direction from the bit line contact to the cell array area.

17. The integrated circuit device of claim 11, wherein a lowermost surface of at least a portion of the cell device isolation film is at a first vertical level having a first vertical distance from the upper surface of the substrate, sidewalls of at least some of the plurality of peripheral device isolation films each comprise an upper sidewall extending along a first line having a first inclination and a lower sidewall extending along a second line having a second inclination that is different from the first inclination of the first line, and a point at which the upper sidewall transitions to the lower sidewall is at a position selected from a range between a lower vertical level, which is farther from the upper surface of the substrate than the first vertical level, and an upper vertical level, which is closer to the upper surface of the substrate than the first vertical level, a first vertical distance between the first vertical level and the lower vertical level and a second vertical distance between the first vertical level and the upper vertical level each being 700 Å or less.

18. The integrated circuit device of claim 11, further comprising:

a word line at a vertical level, which is lower than a vertical level of the upper surface of the substrate, the word line being in the cell array area and extending lengthwise in the first horizontal direction across the plurality of cell active regions;

a wiring pattern over the substrate; and a word line contact extending in the vertical direction between the word line and the wiring pattern, the word line contact being configured to be electrically connected to each of the word line and the wiring pattern, wherein, in the first horizontal direction, the active dam is between the word line contact and a peripheral active region among the plurality of peripheral active regions, the peripheral active region being located in the sub-word line driver area and is closest to the word line contact.

19. An integrated circuit device comprising:

a substrate having a cell array area, a peripheral circuit area, and an interface area, the peripheral circuit area comprising a core area having a sub-word line driver area and a sense amplifier area, the interface area being between the cell array area and the sub-word line driver area and between the cell array area and the sense amplifier area, the sub-word line driver area being adjacent to the cell array area in a first horizontal direction, and the sense amplifier area being adjacent to the cell array area in a second horizontal direction that intersects with the first horizontal direction;

a cell device isolation film arranged in the substrate to define a plurality of cell active regions in the cell array area of the substrate, the cell device isolation film having a first depth in a vertical direction from an upper surface of the substrate;

a plurality of word lines at a vertical level lower than a vertical level of the upper surface of the substrate, the plurality of word lines being in the cell array area and extending parallel to each other across the plurality of cell active regions in the first horizontal direction;

a plurality of bit lines over the plurality of word lines in the cell array area and extending lengthwise parallel to each other in the second horizontal direction that intersects with the first horizontal direction;

a plurality of peripheral device isolation films arranged in the substrate to define a plurality of peripheral active regions in the sub-word line driver area and the sense amplifier area of the substrate, each of the plurality of peripheral device isolation films having a second depth in the vertical direction from the upper surface of the substrate, the second depth being greater than the first depth;

an interface device isolation film in the interface area of the substrate; and an active dam having a closed-loop shape that continuously surrounds the cell array area without interruption, in a plan view, wherein the active dam comprises a first local region in the sub-word line driver area of the core area and a second local region in the sense amplifier area of the core area or in a portion of the cell array area adjacent to the sense amplifier area.

20. The integrated circuit device of claim 19, further comprising:

a wiring pattern apart from the substrate in the vertical direction with the plurality of bit lines therebetween; and a word line contact extending in the vertical direction between a word line, which is selected from the plurality of word lines, and the wiring pattern, the word line contact being configured to be electrically connected to each of the word line and the wiring pattern, wherein, in the first horizontal direction, the active dam is between the word line contact and a peripheral active region, which is in the sub-word line driver area and is closest to the word line contact, among the plurality of peripheral active regions, and each of sidewalls of at least some of the peripheral device isolation films comprises an upper sidewall and a lower sidewall, the lower sidewall being farther from the upper surface of the substrate than the upper sidewall, and an inclination of the upper sidewall being different from an inclination of the lower sidewall.

* * * * *